(12) United States Patent
Tsukamoto et al.

(10) Patent No.: US 7,345,910 B2
(45) Date of Patent: Mar. 18, 2008

(54) SEMICONDUCTOR DEVICE

(75) Inventors: Yasumasa Tsukamoto, Tokyo (JP); Koji Nii, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 112 days.

(21) Appl. No.: 11/211,682

(22) Filed: Aug. 26, 2005

(65) Prior Publication Data

US 2006/0044866 A1    Mar. 2, 2006

(30) Foreign Application Priority Data

Aug. 30, 2004 (JP) .............................. 2004-249757
Jul. 14, 2005  (JP) .............................. 2005-205224

(51) Int. Cl.
*G11C 11/00* (2006.01)
(52) U.S. Cl. ........................ 365/154; 365/196; 365/207
(58) Field of Classification Search ................ 365/154, 365/196, 207
See application file for complete search history.

(56) References Cited

U.S. PATENT DOCUMENTS 5,654,926 A  *  8/1997  Kanzaki ...................... 365/203
5,757,696 A  *  5/1998  Matsuo et al. .......... 365/185.07
2004/0042305 A1 *  3/2004  Joo .............................. 365/205
2004/0164326 A1 *  8/2004  Atwood et al. ............. 257/202

FOREIGN PATENT DOCUMENTS

JP       8-180684       7/1996
JP       10-112188      4/1998

OTHER PUBLICATIONS

Amrutur, et al., "A Replica Technique for Wordline and Sense Control in Low-Power SRAM's", IEEE Journal of Solid-State Circuits, vol. 33, No. 8, Aug. 1998.

* cited by examiner

*Primary Examiner*—Thong Q. Le
(74) *Attorney, Agent, or Firm*—McDermott Will & Emery LLP

(57) ABSTRACT

The invention provides a semiconductor device capable of reducing wasteful power consumption. The semiconductor device of the invention does not require a refresh operation, and includes memory circuits for storing data, arranged in a matrix form, first signal lines for reading data from the memory circuits, second signal lines for transferring a signal that controls connection between the memory circuits and the first signal lines, a sense amplifier circuit for reading and determining data by detecting a potential change or a current change in the first signal lines, and a mitigating means for mitigating the potential change or the current change in the first signal lines during a period in which the sense amplifier circuit is being activated.

15 Claims, 22 Drawing Sheets

| SE | NMOS 41 | VL |
|---|---|---|
| L (DISABLED) | ON | 0V |
| H (ENABLED) | OFF | ~0.4V |

| CS | SE | NMOS 41 | VL |
|---|---|---|---|
| L (UNSELECTED STATE) | L (DISABLED) | OFF | ~0.4V |
| ～ | H (ENABLED) | OFF | ~0.4V |
| H (SELECTED STATE) | L (ENABLED) | ON | 0V |
| ～ | H (ENABLED) | OFF | ~0.4V |

| SE | PMOS 131 | VL |
|---|---|---|
| L (DISABLED) | ON | 1.2V (VDD) |
| H (ENABLED) | OFF | 1.2V～0.8V |

F I G . 1 5
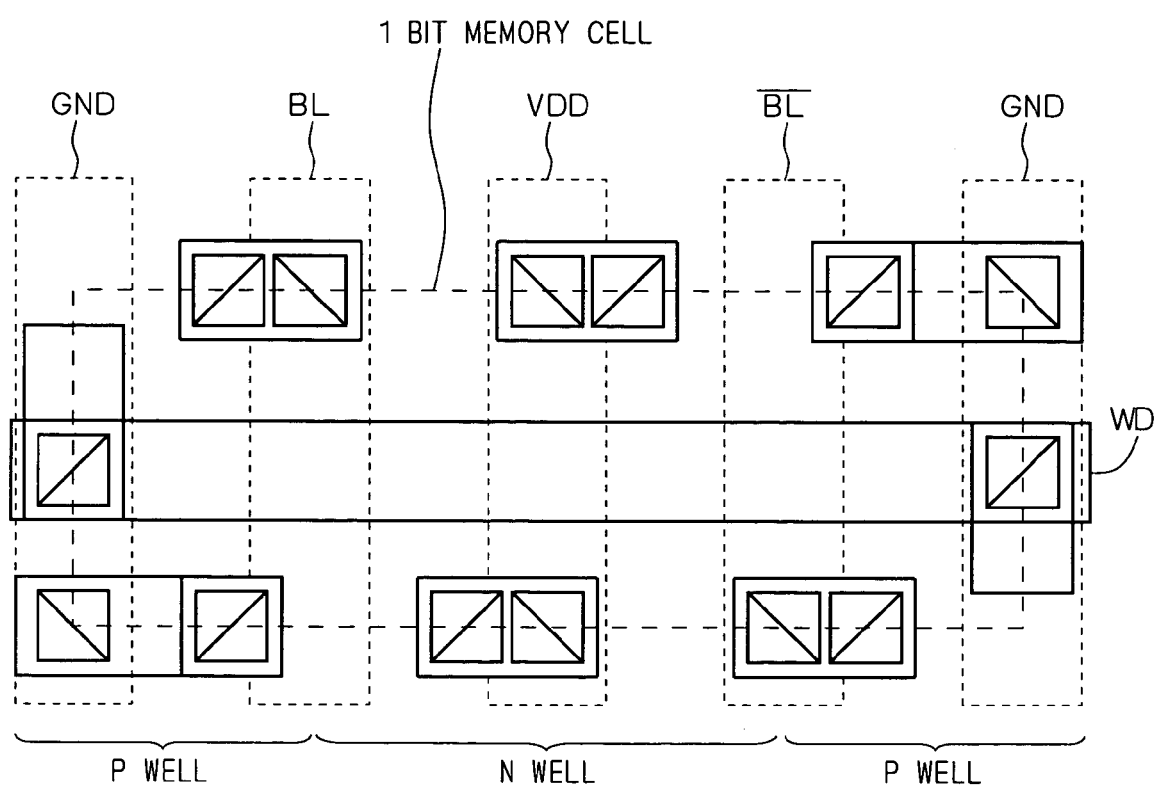

F I G . 1 6 A
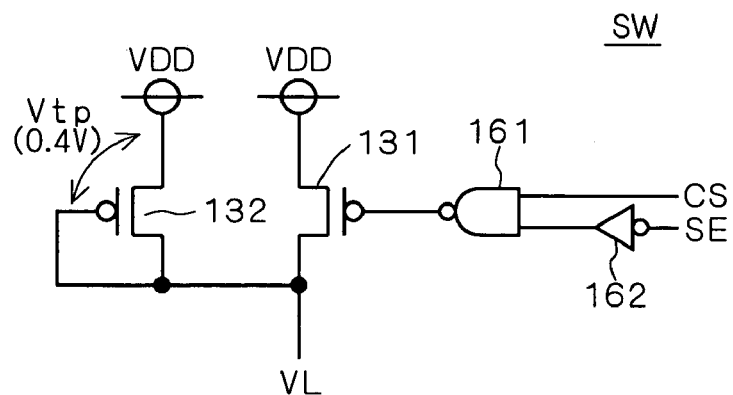
F I G . 1 6 B
| CS | SE | PMOS 131 | VL |
|---|---|---|---|
| L | L | OFF | 1.2V~0.8V |
| 〃 | H | OFF | 1.2V~0.8V |
| H | L | ON | 1.2V |
| 〃 | H | OFF | 1.2V~0.8V |

| AS | SE | NMOS41 | VL |
|---|---|---|---|
| L | L or H | OFF | ~0.4V |
| H | L | ON | 0V |
| H | H | OFF | ~0.4V |

| AS | CS | SE | NMOS41 | VL |
|---|---|---|---|---|
| L | L or H | L or H | OFF | ~0.4V |
| H | L | L or H | OFF | ~0.4V |
| H | H | L | ON | 0V |
| H | H | H | OFF | ~0.4V |

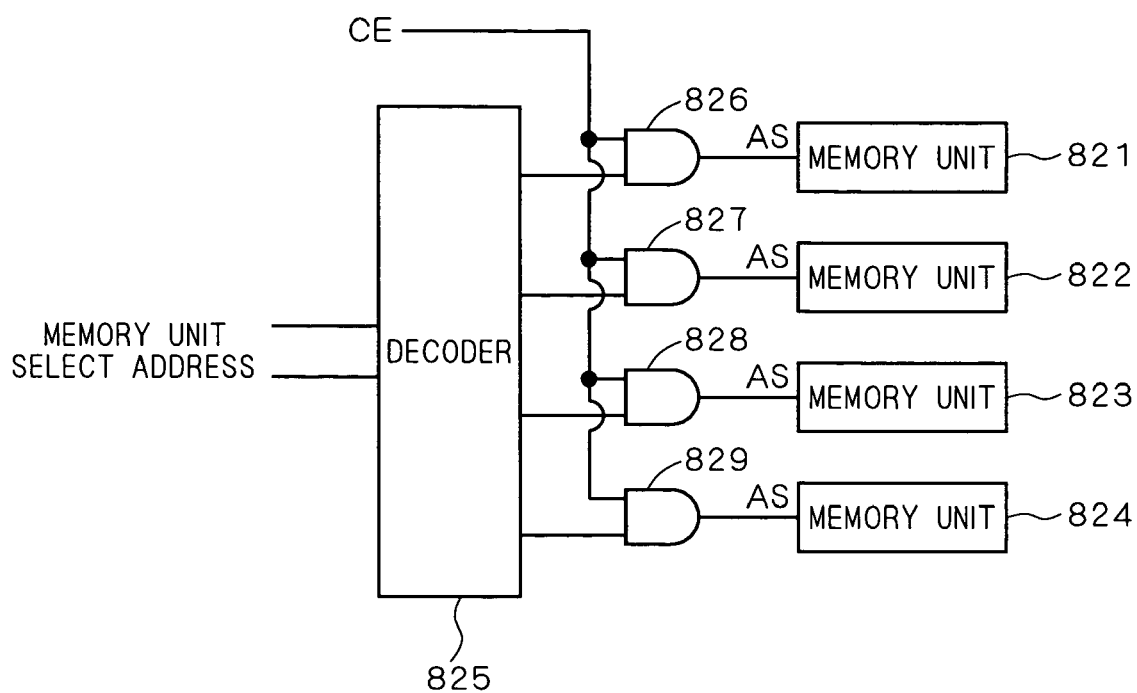
F I G . 2 7

SEMICONDUCTOR DEVICE

BACKGROUND OF THE INVENTION

1. Field of the Invention

The present invention relates to semiconductor devices, and more particularly to a semiconductor device having a memory unit that is capable of reducing power consumption.

2. Description of the Background Art

In recent years, static random access memories (hereinafter also referred to as SRAMs), multi-port memories, and the like that are incorporated in system LSIs or the like tend to have a larger storage scale and a higher operating frequency. With this tendency, the increase in operating power has been a problem in the SRAMs and the like. With the SRAMs and the like, the charge/discharge current caused by the oscillation of a signal in bitlines takes up a large proportion in the operating power. Thus, in order to reduce the operating power in SRAMs and the like, it is important to reduce the charge/discharge current in the bitlines.

In the case of SRAM, as the potential of a wordline rises in reading data, the potential of one of bitline pair gradually reduces according to the data retained in a memory cell circuit. Concurrently, the potential of one of the IO line pair selected by a column decoder, among the IO line pairs connected to the bitline pair, reduces likewise. At the time when a sufficient potential difference in the bitline pair (IO line pair) can be obtained, the potential difference in the IO line pair is amplified by a sense amplifier circuit to determine whether the data contained within the target cell is "1" or "0".

Ideally, if the wordline is deactivated at the time the sense amplifier circuit determines the data, the potential of one of the bitline pair does not continue to reduce after the foregoing time, and it is thus possible to prevent wasteful current from flowing and unnecessary power from being consumed. However, in order to deactivate the wordline with that timing, optimization in timing design is difficult; thus, it has been necessary to provide an operation margin when taking process variations and the like into consideration. In other words, to ensure an operation margin, it has been necessary to provide a certain period of time from the foregoing time until the wordline is deactivated.

If a large operation margin before the wordline is deactivated is provided as described above, the potential of the bitline pair reduces unnecessarily during that period because of the activated memory cell. This causes a problem that a wasteful current flows through the bitline pair and a more power than is necessary is required in precharging.

To solve the foregoing problem, a method of locally deactivating a wordline using a replica circuit is proposed in "A Replica Technique for Wordline and Sense Control in Low-Power SRAM's," IEEE Journal of Solid-State Circuits, Vol. 33, pp. 1208-1219, August 1998.

The method proposed in the foregoing reference, however, merely intends to locally control the time for deactivating a wordline using the replica bitline, and it does not necessarily guarantee that the time for determining data is always earlier than the time for deactivating the wordline. Therefore, the time for determining data can be later than the time for deactivating the wordline depending on the semiconductor devices because of process variations.

If the time for determining data becomes later, a sufficient potential difference in a bitline pair cannot be obtained and consequently correct data may not be read out by the sense amplifier circuit. For this reason, it has been necessary even in the case of the method proposed in foregoing reference to ensure an operation margin so that data is retrieved by the sense amplifier circuit and after a short while the wordline is deactivated. That is, even with the method proposed in the foregoing reference, the potential of the bitline pair continues to reduce during the time from the time data is determined until the wordline is deactivated because an operation margin needs to be ensured, and consequently unnecessary power is wasted.

SUMMARY OF THE INVENTION

It is an object of the present invention to provide a semiconductor device capable of reducing wasteful power consumption.

The present invention provides, in accordance with one aspect, a semiconductor device having a memory unit that does not require a refresh operation, the device including memory circuits, first signal lines, second signal lines, a sense amplifier circuit, and mitigating means. The memory circuits are arranged in a matrix form, and are for storing data. The first signal lines are for reading the data from the memory circuits. The second signal lines are for transferring a signal that controls connection between the memory circuits and the first signal lines. The sense amplifier circuit is for reading and determining data by detecting a potential change or a current change in the first signal lines. The mitigating means is for mitigating the potential change or the current change in the first signal lines during a period in which the sense amplifier circuit is being activated.

The semiconductor device according to the foregoing aspect of the invention has an advantage of reducing unnecessary power consumption because it is provided with the mitigating means for mitigating the potential change or the current change in the first signal lines during the period in which the sense amplifier circuit is being activated.

The present invention provides, in accordance with another aspect, a semiconductor device including a plurality of memory units that do not require a refresh operation, and a central processing unit. Each of the memory units includes: memory circuits for storing data, arranged in a matrix form; first signal lines for reading the data from the memory circuits; second signal lines for transferring a signal that controls connection between the memory circuits and the first signal lines; a sense amplifier circuit for reading and determining data by detecting a potential change or a current change in the first signal lines; and mitigating means for mitigating the potential change or the current change in the first signal lines during a period in which the sense amplifier circuit is being activated. The central processing unit controls the memory units. The mitigating means mitigates the potential change or the current change in the first signal lines even when a memory unit selecting signal supplied from the central processing unit to the memory units is in an unselected state.

The semiconductor device according to the foregoing aspect of the invention has an advantage of reducing unnecessary power consumption further because it mitigates the potential change or the current change in the first signal lines even when the memory units are in a standby state.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a layout plan view of the semiconductor device according to the third preferred embodiment of the present invention.

FIG. 16A is a circuit diagram of a memory cell potential controlling circuit according to a fourth preferred embodiment of the present invention.

FIG. 16B is a state diagram of a memory cell potential controlling circuit according to a fourth preferred embodiment of the present invention.

FIG. 27 is a diagram illustrating the configuration of a circuit for supplying a memory unit selecting signal according to the eighth preferred embodiment of the present invention.

DESCRIPTION OF THE PREFERRED EMBODIMENTS

First Preferred Embodiment

Figure 1:
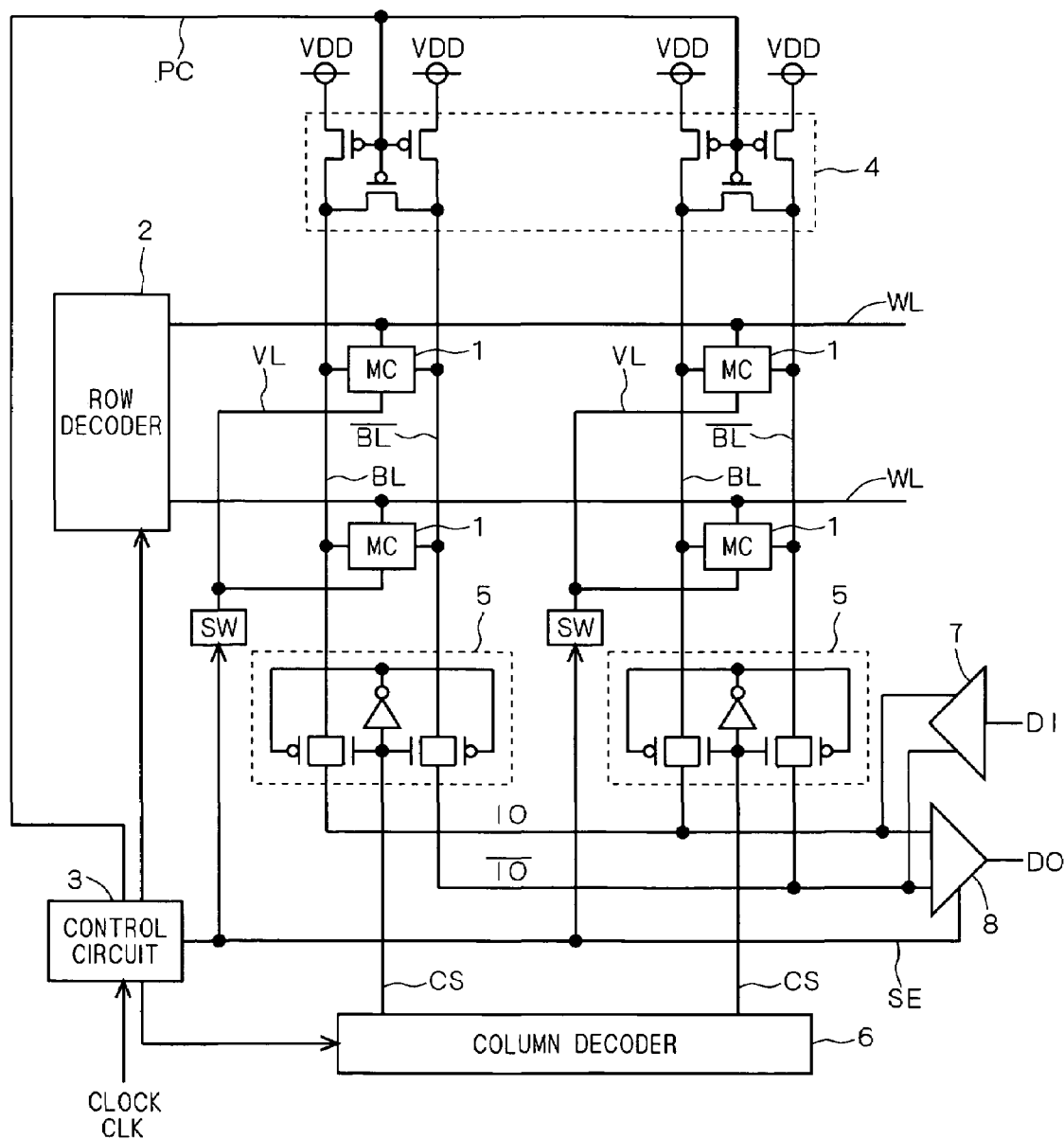
FIG. 1 is a configuration diagram of a semiconductor device according to a first preferred embodiment of the present invention.

The semiconductor device according to the present preferred embodiment is a semiconductor device having a memory unit. FIG. 1 illustrates a configuration diagram of a memory unit of the semiconductor device according to the present preferred embodiment (hereinafter also simply referred to as a "semiconductor device"). In the present preferred embodiment, the description assumes that the memory unit is a SRAM. It should be noted, however, that the present invention is not limited to SRAMs but may be applied to other memories such as multi-port memories and ROMs (Read Only Memories) as long as the memory units do not require refresh operations.

Referring to FIG. 1, the memory unit includes memory cells 1 arranged in a matrix form, and each of the memory cells 1 is connected to wordlines WL and a bitline pair BL and $\overline{BL}$. In the semiconductor device shown in FIG. 1, the wordlines WL are connected to a row decoder 2, and the row decoder 2 is connected to a control circuit 3. One of the bitline pair BL and $\overline{BL}$ is connected to a precharge circuit 4 and the other one is connected to a column select circuit 5.

The precharge circuit 4 is connected to the control circuit 3, and a precharge signal PC is supplied from the control circuit 3. The column select circuit 5 is connected to a column decoder 6, and a column select signal CS is supplied from the column decoder 6. Additionally, the column decoder 6 is connected to the control circuit 3. A bitline BL is connected to an IO line via the column select circuit 5, and a bitline $\overline{BL}$ is connected to an $\overline{IO}$ line via the column select circuit 5. The IO line and $\overline{IO}$ line (hereinafter also referred to as an "IO line pair") are connected to a write driver 7 and a sense amplifier circuit 8. A data input DI inputs data to the IO line pair via the write driver 7, and a date output DO takes data out of the IO line pair via the sense amplifier circuit 8.

The sense amplifier circuit 8 is connected to the control circuit 3 and is supplied with a sense enable signal SE, which is an activating signal for the sense amplifier circuit 8, from the control circuit 3. A clock CLK is input to the control circuit 3. Moreover, in the present preferred embodiment, memory cell potential controlling circuits SW are further provided that are connected to the memory cells 1 by local power supply lines VL. The local power supply lines VL are wired independently for respective columns of memory cells 1, and each one of the memory cell potential controlling circuits SW is provided for each column of memory cells 1. These memory cell potential controlling circuits SW control the potential of the memory cells 1 based on the sense enable signal SE, which is the activating signal for the sense amplifier circuit. A latch-type sense amplifier circuit is used for the sense amplifier circuit 8 in the present preferred embodiment, for example.

Figure 2:
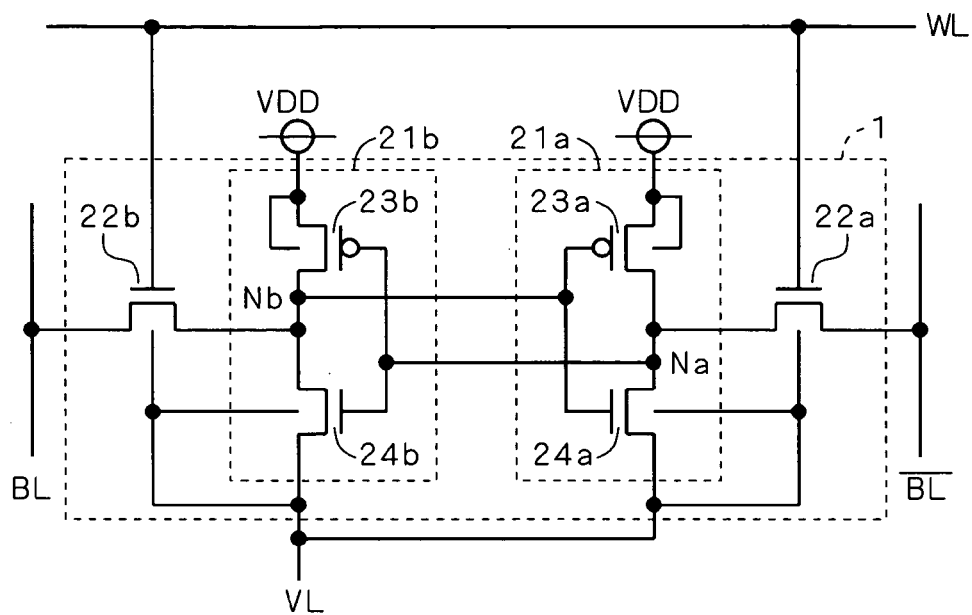
FIG. 2 is a circuit diagram of a memory cell according to the first preferred embodiment of the present invention.

Next, FIG. 2 illustrates a circuit diagram of a memory cell 1 according to the present preferred embodiment. The memory cell 1 shown in FIG. 2 includes inverters 21a and 21b that constitute an inverter latch for storing data, and N-channel MOS transistors (hereinafter also referred to as "NMOSs") 22a and 22b, which are transfer MOS transistors and the gates of which are connected to a wordline WL. The NMOS 22a connects a bitline $\overline{BL}$ to the inverter 21a, while the NMOS 22b connects a bitline BL to the inverter 21b.

The inverter 21a includes a P-channel MOS transistor (hereinafter also referred to as a "PMOS") 23a connected between a node Na and a power supply node for supplying a power supply voltage VDD, and an NMOS 24a connected between the node Na and a local power supply line VL. The inverter 21b includes a PMOS 23b connected between a node Nb and a power supply node for supplying a power supply voltage VDD, and an NMOS 24b connected between the node Nb and the local power supply line VL.

Both the gates of the PMOS 23a and the NMOS 24a are connected to the node Nb, and both the gates of the PMOS 23b and the NMOS 24b are connected to the node Na. The substrate of the PMOSs 23a and 23b are connected to the power supply voltage VDD. The substrate of the NMOSs 22a, 22b, 24a, 24b is connected to the local power supply line VL.

Figure 3:
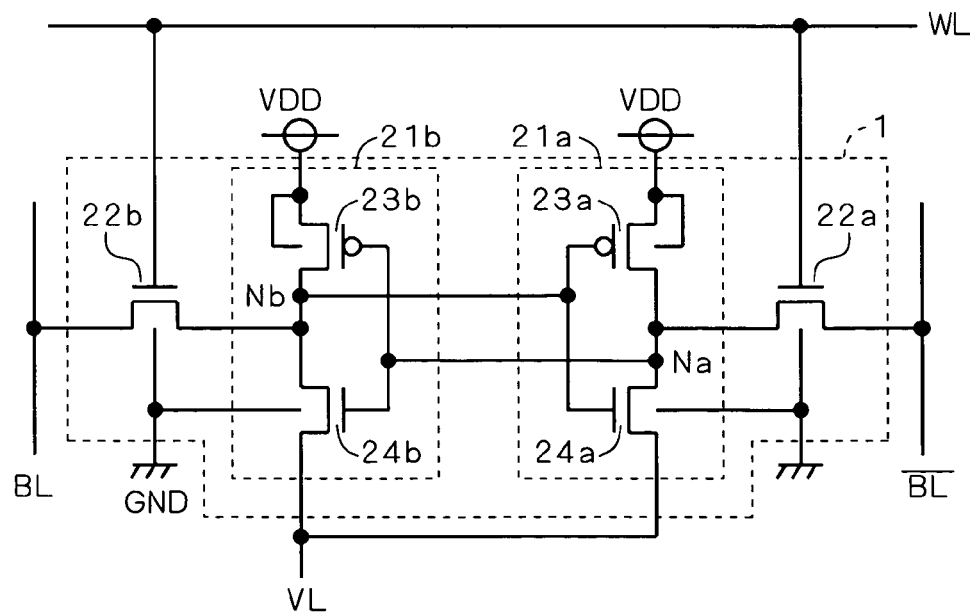
FIG. 3 is a circuit diagram of a memory cell according to the first preferred embodiment of the present invention.

FIG. 3 illustrates a modified example of the memory cell 1 shown in FIG. 2. The memory cell 1 shown in FIG. 3 likewise includes inverters 21a, 21b and NMOSs 22a, 22b. The inverters 21a and 21b include PMOSs 23a and 23b, respectively, and NMOSs 24a and 24b, respectively. However, in the memory cell 1 shown in FIG. 3, the substrate of the NMOSs 22a, 22b, 24a, 24b is connected to GND, unlike the memory cell 1 shown in FIG. 2.

Figures 4A, 4B:
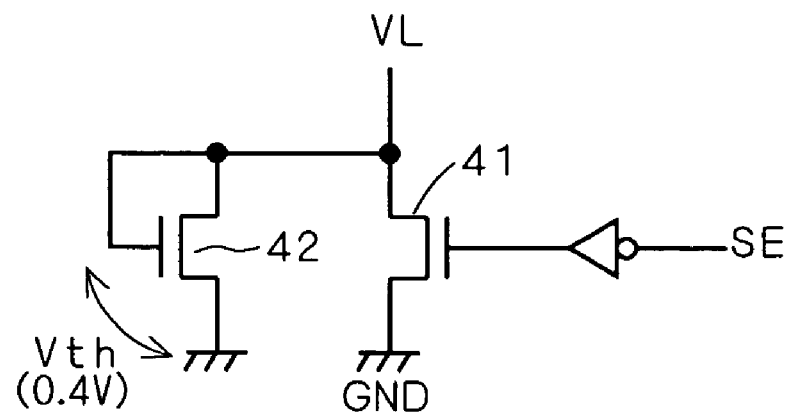
FIG. 4A is a circuit diagram of a memory cell potential controlling circuit according to the first preferred embodiment of the present invention.
FIG. 4B is a state diagram of a memory cell potential controlling circuit according to the first preferred embodiment of the present invention.

Next, the circuit diagram of the memory cell potential controlling circuit SW is shown in FIG. 4A. In the present preferred embodiment, an NMOS 41 is provided for simply performing a control of connecting or disconnecting a local power supply line VL (hereinafter also referred to as a "VL line") to/from GND in response to the sense enable signal SE. Also, a diode-connected NMOS 42 is added for clamping the potential of the VL line so that it does not rise excessively when the VL line is disconnected from GND (when the NMOS 41 is OFF). The NMOS 42 has a role to prevent the data retained in the memory cell 1 from being destroyed because the potential of the VL line does not rise higher than about 0.4 V in a normal operation, assuming that the threshold voltage Vth is about 0.4 V.

FIG. 4B represents states of the memory cell potential controlling circuit SW according to the sense enable signal SE. First, when the sense enable signal SE is "L" (disabled), the NMOS 41 becomes an ON state; consequently, the VL line is connected to GND and therefore its potential is brought to 0 V. When the sense enable signal SE is "H" (enabled), the NMOS 41 becomes an OFF state; consequently, the VL line is disconnected from GND and its potential is brought to at most about 0.4 V due to the effect of the NMOS 42.

Figure 5:
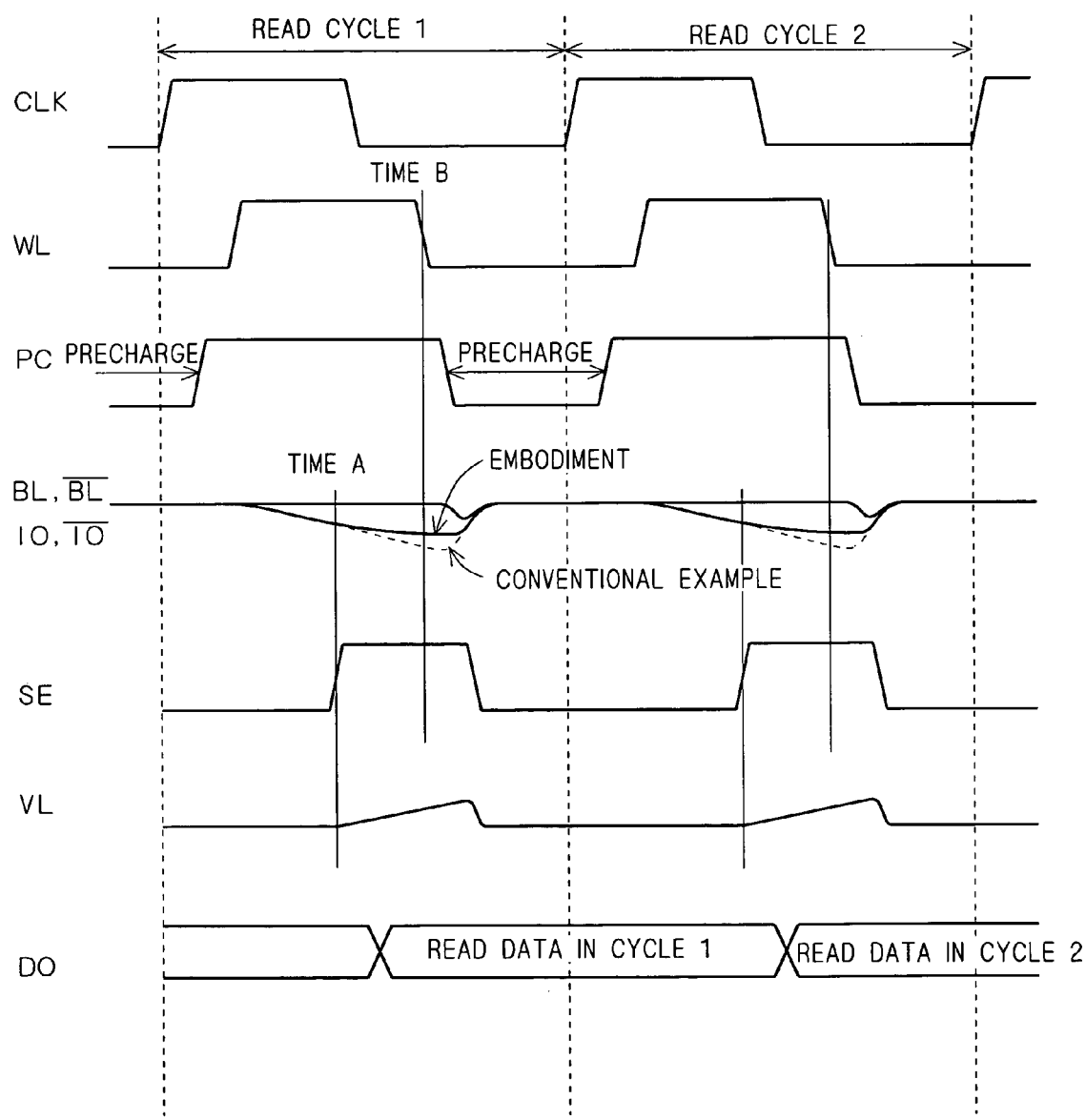
FIG. 5 is a timing chart of the semiconductor device according to the first preferred embodiment of the present invention.

Next, the reading operation of the semiconductor device according to the present preferred embodiment is described briefly. FIG. 5 shows a timing chart of the semiconductor device according to the present preferred embodiment. First, the initial state, which is the state before an access to the memory cells 1 begins (before the rise of the clock CLK), is a precharged state, in which the precharge signal PC is at an "L" level. The precharge circuit 4 that has received an "L" level precharge signal PC precharges the bitline pair BL and $\overline{BL}$ as well as the IO line and the $\overline{IO}$ line to a potential VDD. At this time, all the wordlines WL are at the "L" level and in a deactivated state, and all the memory cells 1 are holding data.

In the precharged state, since the sense enable signal SE is at the "L" level, the potential of the VL line is 0 V. Upon starting the access to the memory cell 1, the clock CLK turns from the "L" level to a "H" level, where a read cycle 1 starts. First, as the precharge signal PC turns from the "L" level to the "H" level, a desired memory cell 1 to be read is selected by the row decoder 2 and the column decoder 6, and the wordline WL is activated and turned from the "L" level to the "H", level. Upon the rise of the wordline WL, the potential of one of the bitline pair BL and $\overline{BL}$ gradually reduces according to the data retained in the memory cell 1. Concurrently, the potential of one of the IO line pair, which is connected to the bitline pair BL and $\overline{BL}$ selected by the column decoder 6 via the column select circuit, reduces likewise.

At the time at which the potential of one of the IO line pair (the bitline pair BL and $\overline{BL}$) reduces and a sufficient potential difference between the IO line and $\overline{IO}$ line is obtained (this time is hereinafter referred to as "time A"), the sense amplifier circuit 8 amplifies and reads out the potential difference in the IO line pair in response to a rise signal of the sense enable signal SE. Then, the sense amplifier circuit 8 determines, from the potential difference of the IO line pair that has been read out, whether the data read out from the memory cell 1 is "1" or "0". The determined data is transferred to the date output DO and is then output.

After the sense amplifier circuit 8 determines the data, the clock CLK returns from the "H" level to the "L" level, and thereafter the wordline WL also returns from the "H" level to the "L" level and is deactivated. Conventionally, until the time at which the wordline WL is deactivated (this time is hereinafter referred to as "time B"), the potential of the bitline pair BL and $\overline{BL}$ continues to reduce (cf. the dashed line portions for the bitline pair BL and $\overline{BL}$ in FIG. 5). Since the determining of the data has already done at the time A essentially, it is unnecessary that the potential of the bitline pair BL and $\overline{BL}$ continues to reduce until the time B; but rather, it means that unnecessary current flows therethrough, which has been an impediment to reducing power consumption.

In view of this problem, in the present preferred embodiment, the memory cell potential controlling circuit SW receives the "H" level sense enable signal SE at time A and turns the NMOS 41 to an OFF state to disconnect the VL line from GND. On the other hand, the wordline WL is still being activated, and current keeps flowing through the memory cell 1. For this reason, charge is gradually accumulated in the VL line, raising the potential. FIG. 5 shows the state in which the potential of the VL line rises from the time A. It should be noted that the potential of the VL line is at most about 0.4 V because of the effect of the NMOS 42.

When the potential of the VL line rises, the source potential of the NMOSs 24*a* and 24*b* in the memory cell 1 rises; consequently, the voltage between the gate and the source decreases, reducing the current flowing through the memory cell 1. Thereby, the potential drop in the bitline pair BL and $\overline{BL}$ is mitigated, and the potential change becomes smaller than in the conventional case. FIG. 5 also shows the state in which the potential change in the bitline pair BL and $\overline{BL}$ is mitigated.

Thereafter, the wordline WL is brought to the "L" level and deactivated, and the precharge signal PC is also brought to the "L" level. The precharge circuit 4 receives an "L" level precharge signal PC and precharges the bitline pair BL and $\overline{BL}$ as well as the IO line and the $\overline{IO}$ line again to a potential VDD. The memory cell potential controlling circuit SW receives an "L" level sense enable signal SE and turns the NMOS 41 into an ON state to connect the VL line to GND. Thereby, the potential of the VL line, which has been floated, is brought back to GND, making it possible to prepare for the access for the next cycle. That is, a next read cycle 2 starts when the clock CLK turns again to the "H" level from the "L" level.

As described above, the potential change in the bitline pair BL and $\overline{BL}$ (IO line pair) after the time A is mitigated in the semiconductor device according to the present preferred embodiment; therefore, unnecessary potential drop in the bitline pair BL and $\overline{BL}$ can be prevented even when the period from the time A to the time B becomes longer due to process variations, voltage fluctuations, temperature variations, and the like, and power consumption is reduced.

Moreover, since in the semiconductor device according to the present preferred embodiment the potential of the potential of the bitline pair BL and $\overline{BL}$ at the time B is higher than that in the conventional case, the time it takes to raise the potential of the bitline pair BL and $\overline{BL}$ to the potential VDD can be made short in precharging the bitline pair BL and $\overline{BL}$. In other words, the semiconductor device according to the present preferred embodiment can shorten the precharge time and therefore makes possible a high-speed operation, in which the reading cycle time is shortened.

Furthermore, with the semiconductor device according to the present preferred embodiment, it is not necessary to shorten the period from the time A to the time B forcibly; therefore, it is possible to employ a design in which a sufficient margin can be ensured for that period, making it possible to perform stable read operations without causing erroneous determining in the sense amplifier circuit 8.

Further, the semiconductor device according to the present preferred embodiment can shorten the length of the line through which the sense enable signal SE flows by arranging the memory cell potential controlling circuit SW near the sense amplifier circuit 8, and therefore makes it possible to minimize an increase in power for driving the sense enable signal SE, preventing an unnecessary increase in power consumption originating from the addition of the memory cell potential controlling circuit SW.

When the semiconductor device according to the present preferred embodiment employs the configuration shown in FIG. 3, in which the VL line is connected only to the sources of the NMOSs 24*a* and 24*b*, a rise in the potential of the VL line also causes a potential difference between the substrate and the sources, increasing the threshold value Vth of the NMOSs 24*a* and 24*b* due to the substrate bias effect. Therefore, in the semiconductor device employing the configuration of FIG. 3, the current drive capability of the NMOSs 24*a* and 24*b* is lower than the semiconductor device employing the configuration of FIG. 2, making it possible to suppress the potential drop in the bitline pair BL and $\overline{BL}$ further.

In addition, since the threshold value Vth of the NMOSs 24*a* and 24*b* becomes higher in the semiconductor device employing the configuration of FIG. 3 due to the substrate bias effect, it is also possible to reduce leakage current in the memory cells 1 from which data are not read out, and a further reduction in power consumption becomes possible.

Furthermore, in the semiconductor device employing the configuration of FIG. 3, the substrate (P well) of the NMOSs 24*a* and 24*b* may be kept at the potential of the GND and therefore can be connected commonly with other GND lines, eliminating the necessity of making a triple well. Thus, the semiconductor device employing the configuration of FIG. 3 is advantageous in terms of cost since it is possible to reduce the number of masks required by one.

It should be noted that although the present preferred embodiment has illustrated an example in which a VL line is independently wired for each column of the memory cells 1, the present invention is not limited to this configuration and it is possible to employ a configuration in which a VL line is commonly connected to a plurality of columns. It is also possible to employ a configuration in which all the memory cells 1 contained in the semiconductor device are commonly connected to a common VL line. The present invention may also employ a configuration in which the memory cells are connected independently to respective VL lines.

Figure 6:
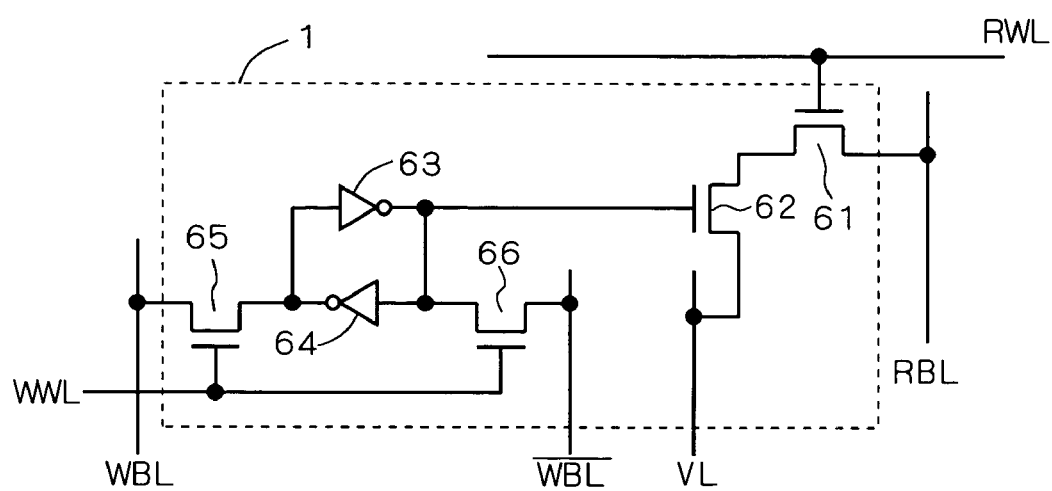
FIG. 6 is a circuit diagram of a multi-port memory according to the first preferred embodiment of the present invention.
Figure 7:
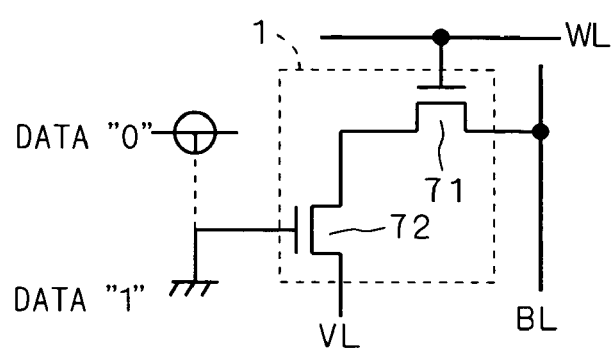
FIG. 7 is a circuit diagram of a ROM according to the first preferred embodiment of the present invention.

Furthermore, the semiconductor device according to the present preferred embodiment is not limited to an SRAM but may be a multi-port memory, ROM, or the like. Hereinbelow, a circuit diagram of a memory cell in a multi-port memory is illustrated in FIG. 6, and a circuit diagram of a memory cell in a ROM is illustrated in FIG. 7. It should be noted that the configurations in the multi-port memory and the ROM are substantially the same as those of the SRAM shown in FIG. 1 except the memory cells, and the timing chart is also substantially the same as that of the SRAM shown in FIG. 5; therefore, the detailed discussion will be omitted.

First, a memory cell 1 shown in FIG. 6 that consititutes a multi-port memory has six transistors and one port. NMOSs 61 and 62 are connected between a read bitline RBL and a VL line, and the gate terminal of the NMOS 61 is connected to a read wordline RWL. The gate terminal of the NMOS 62 is connected to the inverters 63 and 64. Further, an NMOS 65 is provided between the inverters 63, 64 and a write bitline WBL, and an NMOS 66 is provided between the inverters 63, 64 and a write bitline $\overline{WBL}$. The gate terminals of the NMOSs 65 and 66 are connected to a write wordline WWL.

The memory cell 1 shown in FIG. 7 that consititutes a ROM is provided with an NMOS 71 the gate terminal of which is connected to a wordline WL and one terminal of which is connected to a bitline BL. The memory cell 1 is also provided with an NMOS 72 connected to the other one of the terminals of the NMOS 71. One of the terminals of the NMOS 72 is connected to the NMOS 71, and the other one is connected to a VL line. The NMOS 72 connects its gate terminal to a predetermined potential and fixes it to be "H" to retain data "0", or it connects its gate terminal to GND and fixes it to be "L" to retain data "1", according to the ROM code.

Figure 23:
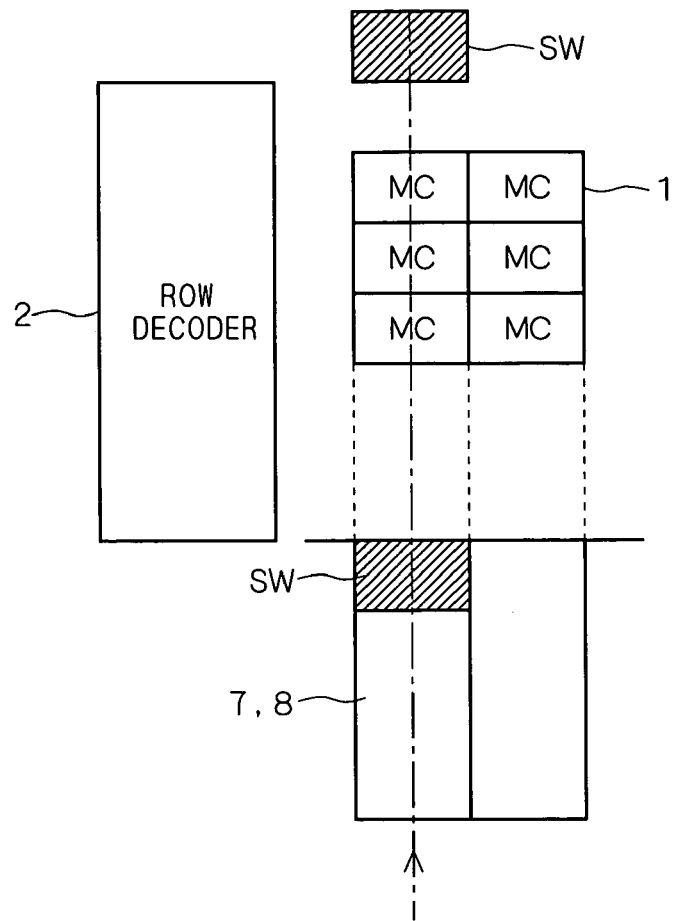
FIG. 23 is a view showing an actual layout image of the semiconductor device according to the first preferred embodiment of the present invention.

FIG. 23 shows an actual layout image of the memory unit of the semiconductor device shown in FIG. 1. The actual layout image shown FIG. 23 illustrates the state in which the memory cells 1 are aligned in a matrix form. In FIG. 23, the row decoder 2 is provided in a region on the left of the region in which the memory cells 1 are aligned, and the write driver 7, the sense amplifier circuit 8, and so forth are provided in a region below the region in which the memory cells 1 are aligned. Because it is necessary that each column of the memory cells 1 be provided with the memory cell potential controlling circuit SW shown in FIG. 1, the memory cell potential controlling circuit SW should be provided either in a region in which there are the sense amplifier circuit 8 and the like, or in a region above the region in which the memory cells 1 are aligned, in the actual layout image shown in FIG. 23. Since the memory cell potential controlling circuit SW is controlled by the signal from the sense amplifier circuit 8 as mentioned previously, it is desirable that the memory cell potential controlling circuit SW be provided in the region in which there are the sense amplifier circuit 8 and so forth, taking the wiring from the sense amplifier circuit 8 into consideration. It should be noted that the controlling of the memory cells 1 by the memory cell potential controlling circuit SW is performed in a column direction. In FIG. 23, the direction of the controlling is indicated by the dash-dotted line.

Second Preferred Embodiment

Next, a second preferred embodiment is described. In the first preferred embodiment, the memory cell potential controlling circuits SW carry out the same operation for all the columns irrespective of whether or not the column is selected by the column decoder 6. In the present preferred embodiment, the memory cell potential controlling circuits SW perform different control operations for memory cells 1 that are to be read out and for memory cells 1 that are not read out.

Figure 8:
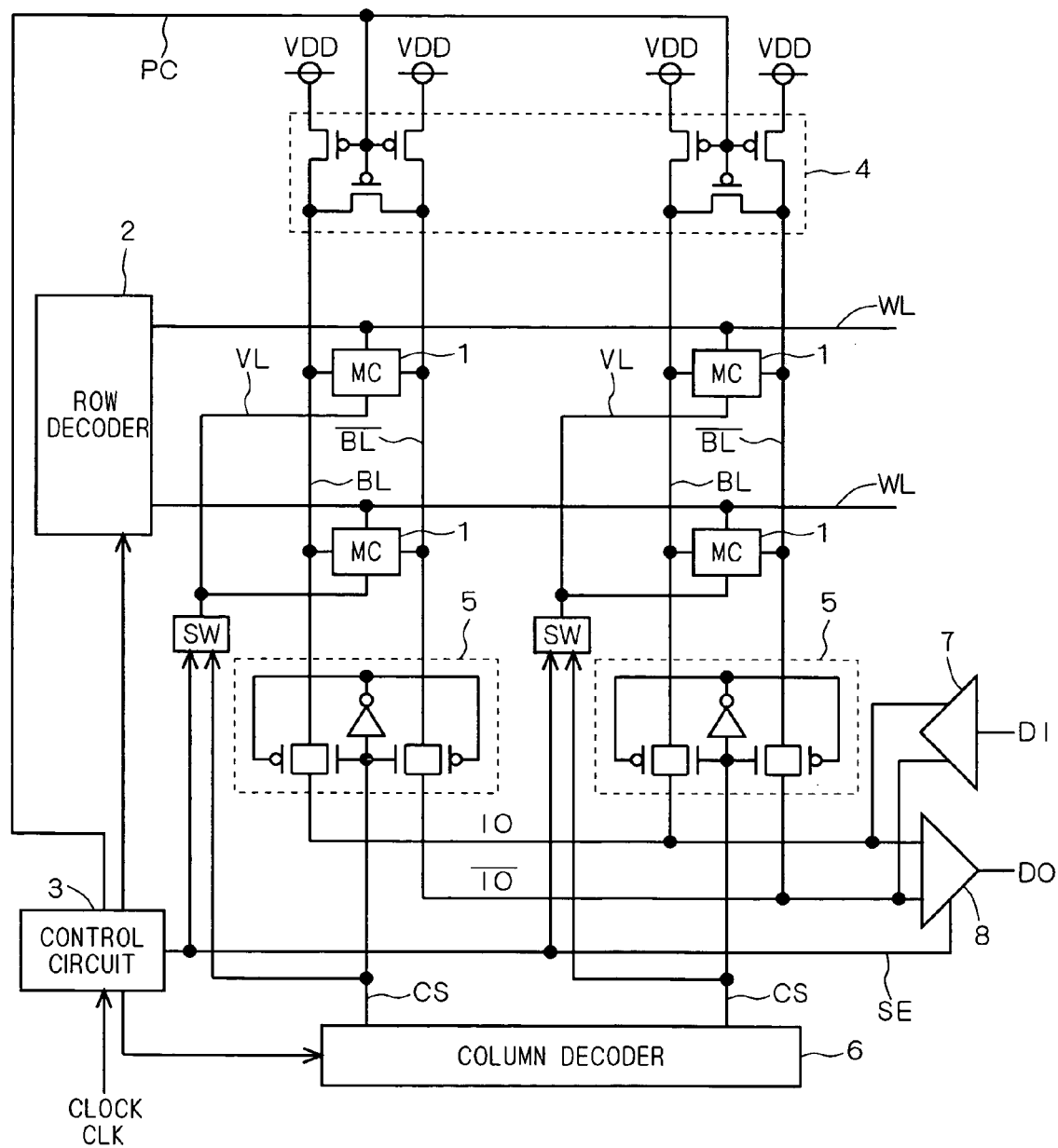
FIG. 8 is a configuration diagram of a semiconductor device according to a second preferred embodiment of the present invention.

FIG. 8 shows a configuration diagram of a semiconductor device according to the present preferred embodiment. The configuration diagram shown in FIG. 8 is basically the same as that shown in FIG. 1, and the present preferred embodiment also describes an SRAM as an example.

First, the semiconductor device shown in FIG. 8 includes memory cells 1 arranged in a matrix form, and each of the memory cells 1 is connected to a wordline WL and a bitline pair BL and $\overline{BL}$. In the semiconductor device shown in FIG. 8, the wordlines WL are connected to a row decoder 2, and the row decoder 2 is connected to a control circuit 3. One of the bitline pair BL and $\overline{BL}$ is connected to a precharge circuit 4, and the other one is connected to a column select circuit 5.

Memory cell potential controlling circuits SW, connected to the memory cells 1 by local power supply lines VL, are provided in the present preferred embodiment as well. Nevertheless, in the present preferred embodiment, the memory cell potential controlling circuits SW control the potential of the memory cells 1 based on a sense enable signal SE, which is an activating signal for a sense amplifier circuit, and a column select signal CS from a column decoder 6. For this reason, in the present preferred embodiment, the VL lines need to be wired independently column by column, or wired to a plurality of columns by a plurality of columns, unlike first preferred embodiment in which there is no problem even when a VL line is commonly connected to all the memory cells 1.

Figures 9A, 9B:
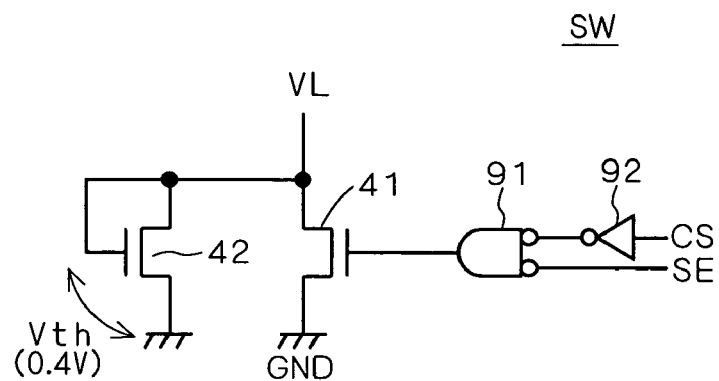
FIG. 9A is a circuit diagram of a memory cell potential controlling circuit according to the second preferred embodiment of the present invention.
FIG. 9B is a state diagram of a memory cell potential controlling circuit according to the second preferred embodiment of the present invention.

FIG. 9A shows a circuit diagram of the memory cell potential controlling circuit SW according to the present preferred embodiment. The memory cell potential controlling circuit SW shown in FIG. 9A is also provided with an NMOS 41 that performs a control of connecting or disconnecting a VL line to/from GND. Also, a diode-connected NMOS 42 is added for clamping the potential of the VL line so that it does not rise excessively when the VL line is disconnected from GND (when the NMOS 41 is OFF). The NMOS 42 has a role to prevent the data retained in the memory cell 1 from being destroyed because the potential of the VL line does not rise higher than about 0.4 V in a normal operation, assuming that the threshold voltage Vth is about 0.4 V.

The memory cell potential controlling circuit SW shown in FIG. 9A is different from the memory cell potential controlling circuit SW shown in FIG. 4A in the respect that the signal input to the gate terminal of the NMOS 41 undergoes a logical operation with the sense enable signal SE and the column select signal CS. Specifically, in FIG. 9A, a NOR gate 91 and an inverter 92 are provided so that the sense enable signal SE is input to one terminal of the NOR gate 91 while the column select signal CS that is inverted by the inverter 92 is input to the other terminal of the NOR gate 91, and the output from the NOR gate 91 is input into the gate terminal of the NMOS 41.

Next, FIG. 9B represents states of the memory cell potential controlling circuit SW according to the sense enable signal SE and the column select signal CS. First, when the sense enable signal SE and the column select signal CS are "L" (disable and unselected state), the NMOS 41 becomes an OFF state; consequently, the VL line is disconnected from GND and its potential is brought to at most about 0.4 V due to the effect of the NMOS 42. Next, when the sense enable signal SE is "H" (enabled) and the column select signal CS is "L" (unselected state), the NMOS 41 becomes an OFF state; consequently, the VL line is disconnected from GND and its potential is brought to at most about 0.4 V due to the effect of the NMOS 42.

Next, when the sense enable signal SE is "L" (disabled) and the column select signal CS is "H" (selected state), the NMOS 41 becomes an ON state; consequently, the VL line is connected to GND and thereby its potential is brought to 0 V. Next, when both the sense enable signal SE and the column select signal CS are "H" (enable and selected state), the NMOS 41 becomes an OFF state; consequently, the VL line is disconnected from GND and its potential is brought to at most about 0.4 V due to the effect of the NMOS 42.

Figure 10:
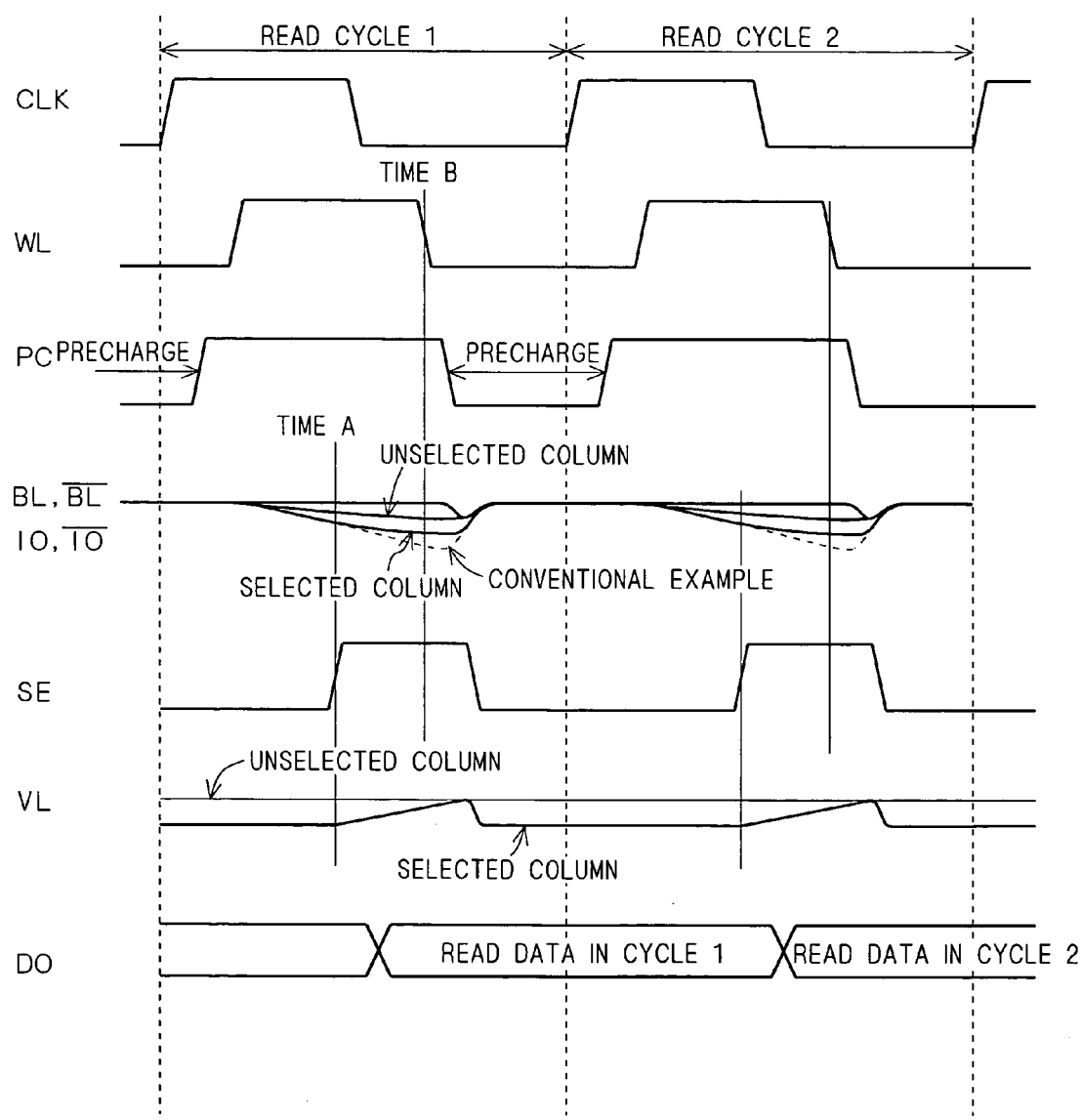
FIG. 10 is a timing chart of the semiconductor device according to the second preferred embodiment of the present invention.

Next, the reading operation of the semiconductor device according to the present preferred embodiment is explained briefly. FIG. 10 shows a timing chart of the semiconductor device according to the present preferred embodiment. Basically, FIG. 10 is similar to the timing chart of the first preferred embodiment shown in FIG. 5, and the initial state that is before an access to the memory cells 1 begins (before the rise of the clock CLK) is a precharged state, in which the bitline pair BL and $\overline{BL}$ as well as the IO line and the $\overline{IO}$ line are precharged to a potential VDD.

In the precharged state, the sense enable signal SE is at the "L" level, but the column select signal CS differs from column to column, and therefore, the state of each memory cell potential controlling circuit SW differs accordingly. Specifically, for a column that is not selected by the column decoder 6 (unselected column), both the sense enable signal SE and the column select signal CS are "L", so the potential of the VL line is raised (about 0.4 V) because the VL line is disconnected from GND, as shown in FIG. 9B. On the other hand, for a column that is selected by the column decoder 6 (selected column), the sense enable signal SE is "L" while the column select signal CS is "H", so the potential of the VL line becomes 0 V, the same as GND, as shown in FIG. 9B.

Next, upon starting an access to the memory cell 1, the clock CLK turns from an "L" level to a "H" level, where a read cycle 1 starts. First, as the precharge signal PC is turned from the "L" level to the "H" level, a desired memory cell 1 to be read is selected by the row decoder 2 and the column decoder 6, and the wordline WL is activated and turned from the "L" level to the "H" level. After the rise of the wordline WL, the potential of one of the bitline pair BL and $\overline{BL}$ gradually reduces according to the data retained in the memory cell 1.

However, in the unselected column, the potential of the VL line is cut off from GND by the memory cell potential controlling circuit SW and is thereby floated; therefore, the potential change in the bitline pair BL and $\overline{BL}$ is mitigated, as discussed in the first preferred embodiment. On the other hand, in the selected column, the potential of one of the bitline pair BL and $\overline{BL}$ gradually reduces because the potential of the VL line is GND until time A, and from the time A to time B, the sense enable signal SE becomes "H" and the potential of the VL line is cut off from GND and is floated; thereby, the potential change in the bitline pair BL and $\overline{BL}$ is mitigated, as in the first preferred embodiment.

As illustrated in FIG. 10, the potential change of the bitline pair BL and $\overline{BL}$ in the unselected column is mitigated from the time point at which the wordline WL is activated, and the potential change of the bitline pair BL and $\overline{BL}$ in the selected column is mitigated from the time A. As will be understood from FIG. 10, the potential change in the bitline pair BL and $\overline{BL}$ in the unselected column becomes less than the potential change in the bitline pair BL and $\overline{BL}$ in the selected column; therefore, power consumption can be further reduced in comparison with the first preferred embodiment.

Thereafter, the wordline WL is brought to the "L" level and is deactivated, and the precharge signal PC is also brought to the "L" level. The precharge circuit 4 receives an "L" level precharge signal PC and precharges the bitline pair BL and $\overline{BL}$ as well as the IO line and the $\overline{IO}$ line again to a potential VDD. The memory cell potential controlling circuit SW receives an "L" level sense enable signal SE, connecting the VL line of the selected column to GND and disconnecting the VL line of the unselected column from GND. Then, a next read cycle 2 starts when the clock CLK turns again from the "L" level to the "H" level.

Thus, with the configuration as described above, the semiconductor device according to the present preferred embodiment exhibits the same advantageous effects as achieved by the first preferred embodiment and moreover enables further reduction in power consumption than the first preferred embodiment because the potential change in the bitline pair BL and $\overline{BL}$ in unselected column can be mitigated from the time point at which the wordline WL is activated.

Furthermore, the semiconductor device according to the present preferred embodiment has an effect of reducing leakage from the memory cells 1 in the unselected column because the potential of the VL line in the unselected column is cut off from GND and is thereby floated. It should be noted that a chip enable signal for controlling whether the SRAM is accessed or not is omitted in the description of the semiconductor device according to the present preferred embodiment; however, when the chip enable signal is in a disabled state (the state in which the access is not made), the potential of all the VL lines can be raised nearly to about 0.4 V by bringing all the column select signals CS into an "L" level (unselected state). This of course makes it possible to further reduce standby leakage current during standby. Further, the semiconductor device according to the present preferred embodiment is not limited to an SRAM but may be a multi-port memory, a ROM, and the like Third Preferred Embodiment Next, a third preferred embodiment is described. A semiconductor device according to the present preferred embodiment has a configuration in which the circuit of the memory cell 1 shown in FIG. 2 or 3, discussed in the first preferred embodiment, is replaced with a circuit of a memory cell 1 shown in FIG. 11 or 12. The memory cell 1 shown in FIG. 11 includes inverters 21a and 21b that constitute an inverter latch for storing data, and NMOSs 22a and 22b the gates of which are connected to a wordline WL. The NMOS 22a connects a bitline $\overline{BL}$ with the inverter 21a, while the NMOS 22b connects a bitline BL with the inverter 21b.

The inverter 21a includes a PMOS 23a connected between a VL line and a node Na, and an NMOS 24a connected between the node Na and GND. The inverter 21b includes a PMOS 23b connected between the VL line and a node Nb, and an NMOS 24b connected between the node Nb and GND.

Both the gates of the PMOS 23a and the NMOS 24a are connected to the node Nb, and both the gates of the PMOS 23b and the NMOS 24b are connected to the node Na. The substrate of the PMOSs 23a and 23b is connected to the VL line. The substrate of the NMOSs 24a and 24b is connected to GND.

Figure 11:
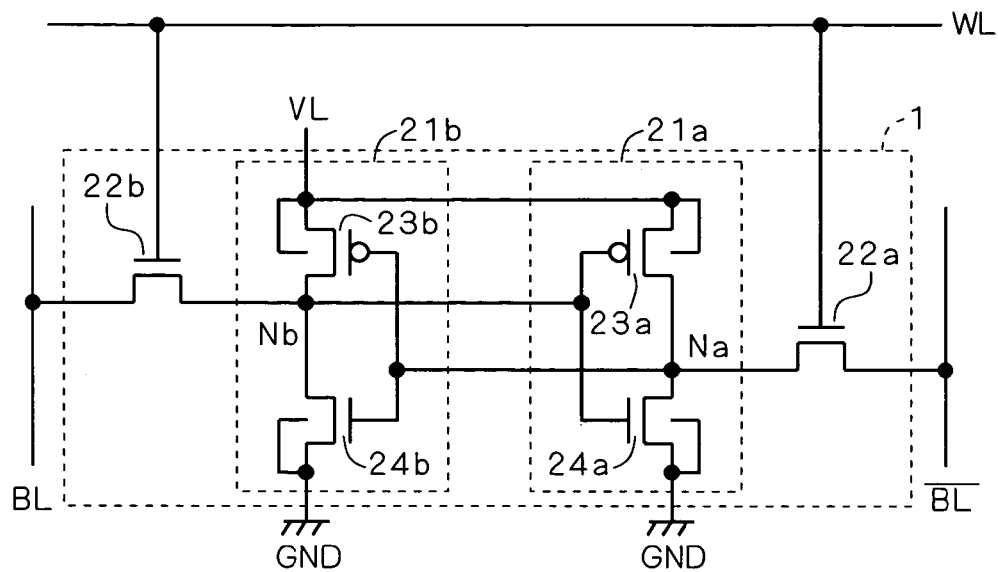
FIG. 11 is a circuit diagram of a memory cell according to a third preferred embodiment of the present invention.
Figure 12:
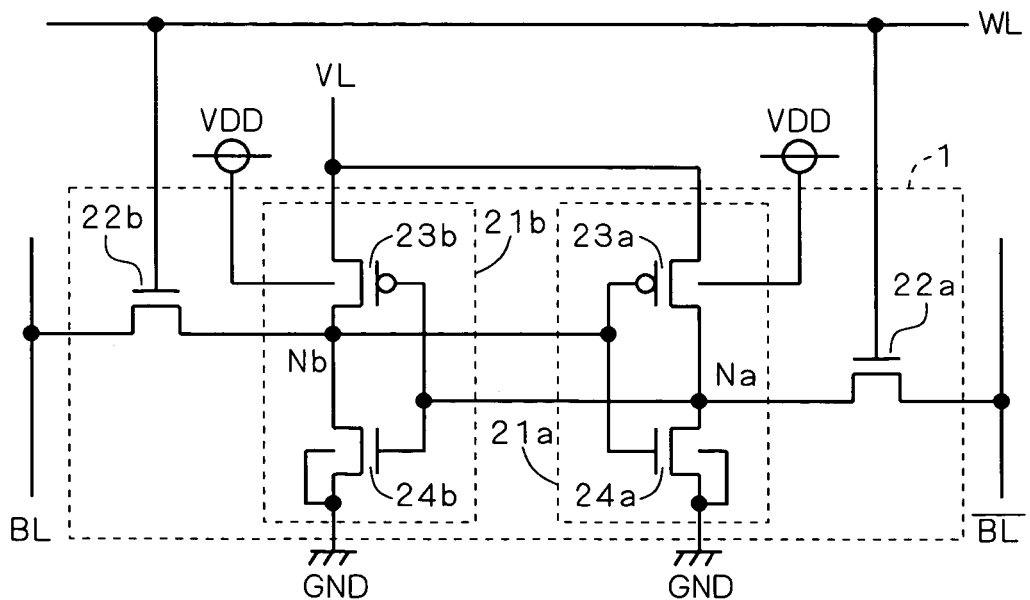
FIG. 12 is a circuit diagram of a memory cell according to the third preferred embodiment of the present invention.

FIG. 12 illustrates a modified example of the memory cell 1 shown in FIG. 11. The memory cell 1 shown in FIG. 12 also includes inverters 21a and 21b, and NMOSs 22a and 22b. The inverters 21a and 21b include PMOSs 23a and 23b, respectively, and NMOSs 24a and 24b, respectively. In the memory cell 1 shown in FIG. 12, however, the substrate of the PMOSs 23a and 23b is connected to a power supply voltage VDD, unlike the memory cell 1 shown in FIG. 11.

As described above, in the present preferred embodiment, the source potential line (N-well substrate potential line) of the PMOSs 23a and 23b are connected to the VL line, and in this respect, the present preferred embodiment differs from the first preferred embodiment, in which the source potential line (P-well substrate potential line) of the NMOSs 24a and 24b is connected to VL line.

Figures 13A, 13B:
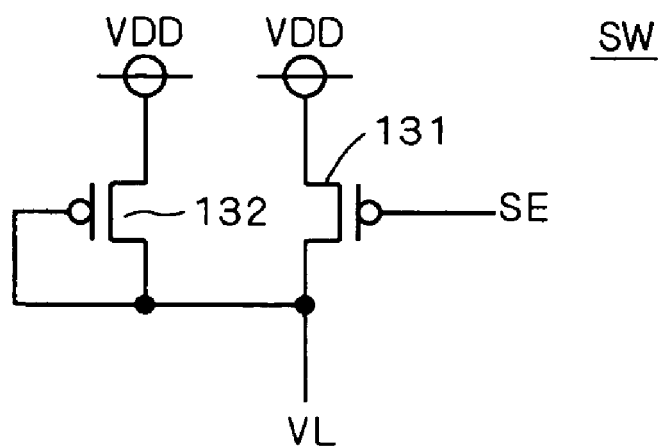
FIG. 13A is a circuit diagram of a memory cell potential controlling circuit according to the third preferred embodiment of the present invention.
FIG. 13B is a state diagram of a memory cell potential controlling circuit according to the third preferred embodiment of the present invention.

As illustrated in FIGS. 11 and 12, because the source potential line of the PMOSs 23a and 23b is connected to the VL line, the configuration of the memory cell potential controlling circuit SW also differs from that shown in FIG. 4A discussed in the first preferred embodiment. FIG. 13A shows a circuit diagram of a memory cell potential controlling circuit SW according to the present preferred embodiment. The memory cell potential controlling circuit SW shown in FIG. 13A is provided with a PMOS 131 that performs a control of connecting or disconnecting the VL line to/from the power supply voltage VDD in response to a sense enable signal SE. Also, a diode-connected PMOS 132 is added for clamping the potential of the VL line so that it does not reduce excessively when the VL line is disconnected from the power supply voltage VDD (when the PMOS 131 is OFF). The PMOS 132 has a role to prevent the data retained in the memory cell 1 from being destroyed because the potential of the VL line does not reduce lower than about 0.8 V in a normal operation, assuming that the power supply voltage VDD is 1.2 V and that the threshold voltage Vth is about 0.4 V.

FIG. 13B represents states of the memory cell potential controlling circuit SW according to the sense enable signal SE. First, when the sense enable signal SE is "L" (disabled), the PMOS 131 becomes an ON state; consequently, the VL line is connected to the power supply voltage VDD and thereby its potential is brought to 1.2 V. When the sense enable signal SE is "H" (enabled), the PMOS 131 becomes an OFF state; consequently, the VL line is disconnected from the power supply voltage VDD and its potential is brought to at lowest about 0.8 V due to the effect of the PMOS 132.

Figure 14:
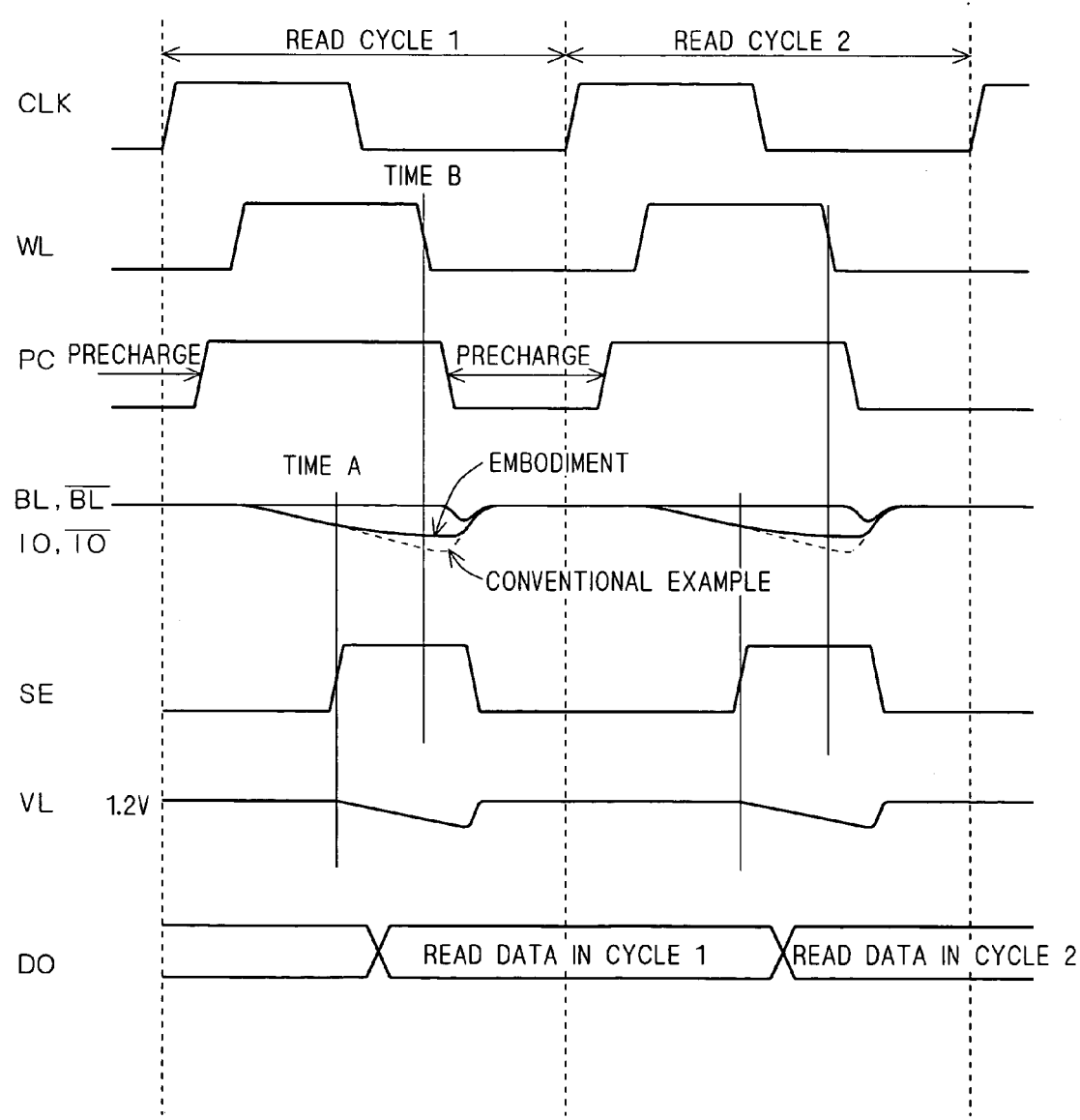
FIG. 14 is a timing chart of the semiconductor device according to the third preferred embodiment of the present invention.

Next, the read operation of the semiconductor device according to the present preferred embodiment will be described briefly. FIG. 14 shows a timing chart of the semiconductor device according to the present preferred embodiment. The timing chart shown in FIG. 14 is basically the same as the timing chart of the first preferred embodiment (FIG. 5) except that the behavior of the potential of the VL line is different. Therefore, only the difference will be explained below and the description of the other respects will be omitted.

First, when the sense enable signal SE changes from an "L" level to a "H" level at time A, the PMOS 131 in the memory cell potential controlling circuit SW becomes an OFF state. When the PMOS 131 becomes the OFF state, the potential of the VL line gradually drops from the potential of the power supply voltage VDD (1.2 V) due to the coupling capacitance with the bitline pair BL and $\overline{BL}$ and leakage current, as illustrated in FIG. 14. Consequently, the voltage between the gates and the sources of the PMOSs 23a and 23b in the memory cell 1 reduces, making it possible to mitigate the potential change in the bitline pair BL and $\overline{BL}$.

Thus, the semiconductor device according to the present preferred embodiment can also mitigate the potential change in the bitline pair BL and $\overline{BL}$ and therefore has an advantageous effect of reducing power consumption. Moreover, the semiconductor device according to the present preferred embodiment makes it possible to provide the VL line without increasing the layout area of the memory cell 1. A Specific description is given below with reference to the layout plan view of the semiconductor device shown in FIG. 15.

First, the layout of the semiconductor device shown in FIG. 15 depicts the wiring line of the power supply voltage VDD, and the wiring lines of the bitline pair BL and $\overline{BL}$ and GND. The area that constitutes a 1-bit memory cell 1 is represented as a portion surrounded by the dashed line in FIG. 15. This dashed line portion is formed so as to straddle over P-well region-N-well region-P-well region. Thus, in the case in which a VL line needs to be connected to each of the NMOSs 22 and 24 of the memory cell 1 as in the first preferred embodiment, it is necessary to wire the VL line to both sides of the P-well regions, and the wiring area for two VL lines is necessary in each of the memory cells 1. As a result, it has been necessary to increase the layout area of the memory cell 1.

In contrast, in the case of the present preferred embodiment, in which the VL line is connected of the PMOS 23, the VL line can be wired only to the N-well region, and consequently, the wiring area for only one VL line is required in each of the memory cells 1. For this reason, it is not particularly necessary to increase the layout area of the memory cell 1 for the purpose of wiring the VL line in the present preferred embodiment.

Fourth Preferred Embodiment

Next, a fourth preferred embodiment will be explained. A semiconductor device according to the present preferred embodiment is an example in which the circuit of the memory cell 1 shown in FIG. 11 or 12 is used in the configuration described in the second preferred embodiment. Thus, the present preferred embodiment utilizes a memory cell potential controlling circuit SW shown in FIG. 16A in place of the memory cell potential controlling circuit SW (FIG. 9A) according to the second preferred embodiment.

In the memory cell potential controlling circuit SW shown in FIG. 16A, a logical operation of the sense enable signal SE and the column select signal CS is input to the gate terminal of the PMOS 131 shown in FIG. 13A. Specifically, in FIG. 16A, a NAND gate 161 and an inverter 162 are provided so that the inverted sense enable signal SE that is inverted by the inverter 162 to one terminal of the NAND gate 161 while a column select signal CS is input to the other terminal of the NAND gate 161, and the output from the the NAND gate 161 is input to the gate terminal of the PMOS 131.

Next, FIG. 16B represents states of the memory cell potential controlling circuit SW according to the sense enable signal SE and the column select signal CS. First, when both the sense enable signal SE and the column select signal CS are "L" (disable and unselected state), the PMOS 131 becomes an OFF state; consequently, the VL line is disconnected from the power supply voltage VDD and its potential is brought to at lowest about 0.8 V due to the effect of the PMOS 132. Next, when the sense enable signal SE is "H" (enabled) but the column select signal CS is "L" (unselected state), the PMOS 131 becomes an OFF state; consequently, the VL line is disconnected from the power supply voltage VDD and its potential is brought to at lowest about 0.8 V due to the effect of the PMOS 132.

Next, when the sense enable signal SE is "L" (disabled) but the column select signal CS is "H" (selected state), the PMOS 41 becomes an ON state; consequently, the VL line is connected to the power supply voltage VDD and thereby its potential is brought to 1.2 V. Next, when both the sense enable signal SE and the column select signal CS are "H" (enable and selected state), the PMOS 131 becomes an OFF state; consequently, the VL line is disconnected from the power supply voltage VDD and its potential is brought to at lowest about 0.8 V due to the effect of the PMOS 132.

Thus, the semiconductor device according to the present preferred embodiment exhibits similar advantageous effects as attained by the second preferred embodiment and the third preferred embodiment.

Fifth Preferred Embodiment

Figure 17:
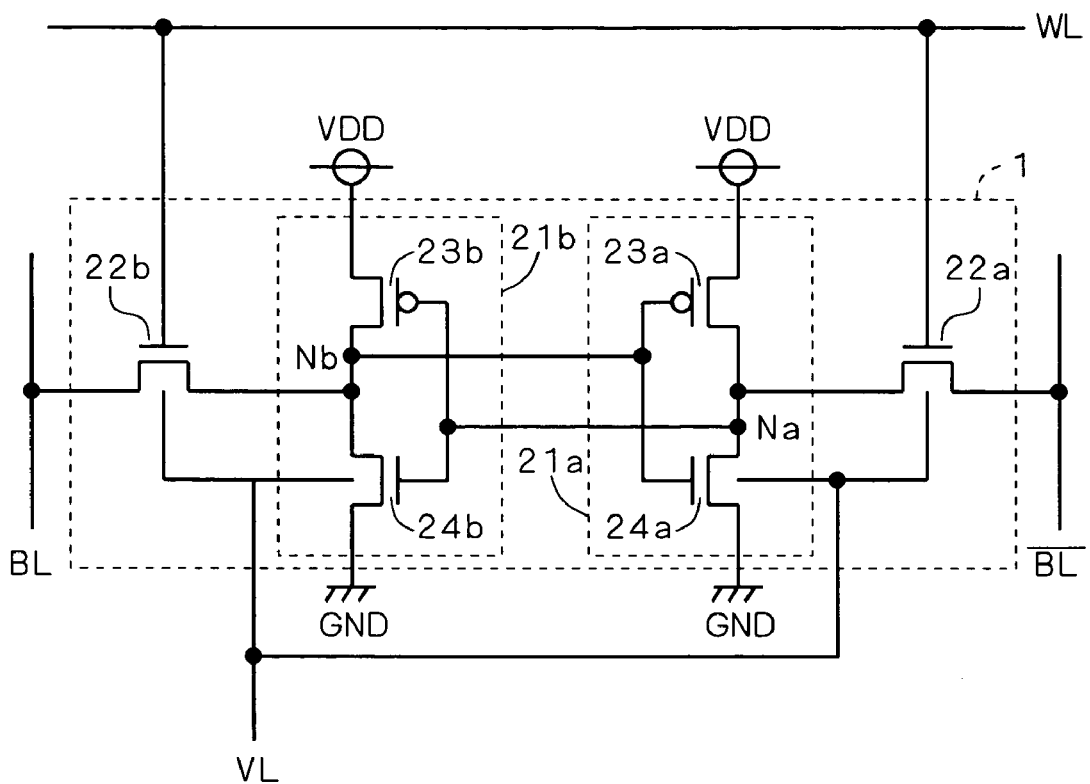
FIG. 17 is a circuit diagram of a memory cell according to a fifth preferred embodiment of the present invention.

Next, a fifth preferred embodiment will be described below. A semiconductor device according to the present preferred embodiment adopts a memory cell 1 shown in FIG. 17 in place of the memory cells 1 described in the first preferred embodiment through the fourth preferred embodiment. The circuit configuration of the memory cell 1 shown in FIG. 17 is configured so that, unlike the circuit configurations shown in FIGS. 2 and 3, the source potential of the NMOSs 24a and 24b is fixed to GND and the substrate potential of the NMOSs 22a, 22b, 24a, 24b can be controlled by a memory cell potential controlling circuit SW connected via a VL line. It should be noted that the configuration diagram of the overall semiconductor device is the same as that of FIG. 1 and therefore the detailed description will be omitted.

Figure 18:
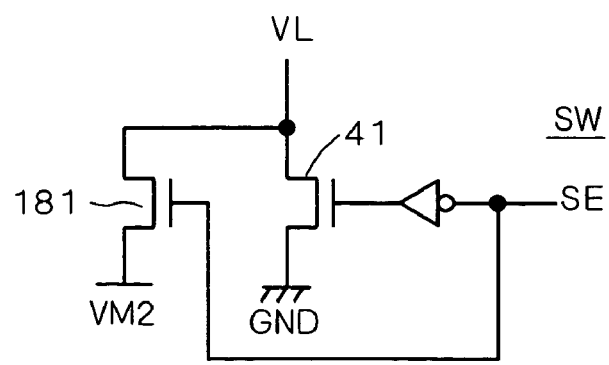
FIG. 18 is a circuit diagram of a memory cell potential controlling circuit according to the fifth preferred embodiment of the present invention.

The VL line shown in FIG. 17 is connected to a memory cell potential controlling circuit SW, and it supplies a substrate potential of the NMOSs 22a, 22b, 24a, 24b based on the sense enable signal. A memory cell potential controlling circuit SW according to the present preferred embodiment is shown in FIG. 18. The memory cell potential controlling circuit SW shown in FIG. 18 is provided with an NMOS 41 that performs a control of connecting or disconnecting the VL line to/from GND in response to the sense enable signal SE. Also, an NMOS 181 is added such as to connect the VL line to a power supply VM2 with a lower potential than GND when the VL line is disconnected from GND (when the NMOS 41 is OFF). Here, the potential of the power supply VM2 is set at about −0.4 V, for example.

In the memory cell potential controlling circuit SW shown in FIG. 18, when the sense enable signal SE is "L" (disabled), the NMOS 41 becomes an ON state; consequently, the VL line is connected to GND and thereby its potential is brought to 0 V. When the sense enable signal SE is "H" (enabled), the NMOS 41 becomes an OFF state, disconnecting the VL line from GND, and at the same time, the NMOS 181 becomes an ON state, connecting the VL line to the power supply VM2. Consequently, the potential of the VL line becomes about −0.4 V.

Figure 19:
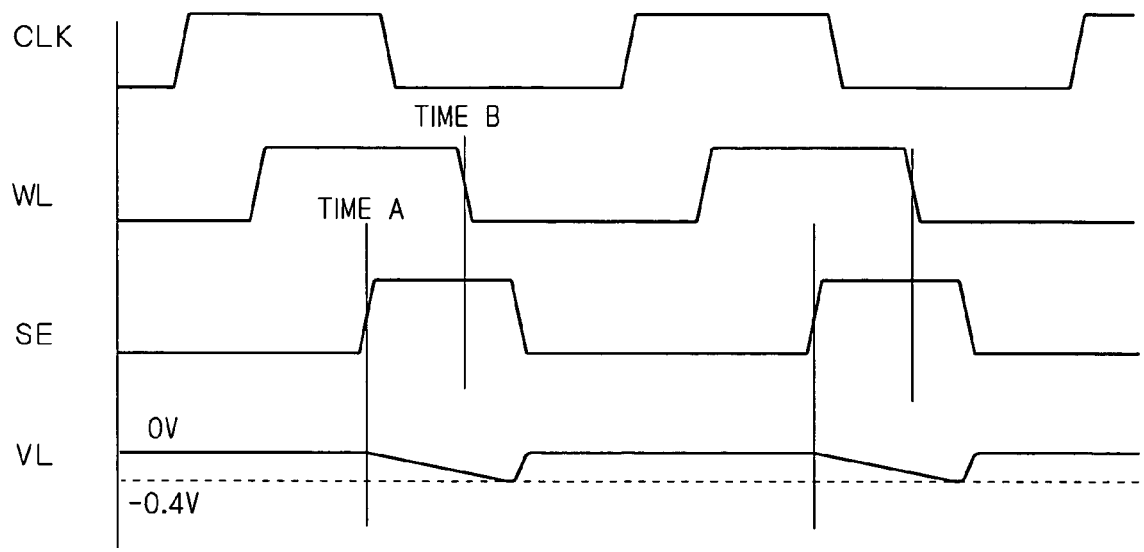
FIG. 19 is a timing chart of the semiconductor device according to the fifth preferred embodiment of the present invention.

Next, a timing chart of the semiconductor device according to the present preferred embodiment is shown in FIG. 19. Hereinbelow, the operation of the semiconductor device according to the present preferred embodiment will be described with reference to the timing chart of FIG. 19. It should be noted that the same signals as shown in the timing chart of FIG. 5 may not be illustrated in the timing chart of FIG. 19. The initial state before the access to the memory cell 1 starts (before the rise of the clock CLK) is a precharged state. In the precharged state, the sense enable signal SE is at an "L" level, and the potential of the VL line is accordingly 0 V. Therefore, the substrate potential of the NMOSs 22a, 22b, 24a, 24b becomes 0 V, which is the same potential as the source potential.

Upon starting the access to the memory cell 1, the clock CLK turns from the "L" level to an "H" level, where a read cycle 1 starts. First, as a precharge signal PC (not shown) turns from the "L" level to the "H" level, a desired memory cell 1 to be read is selected by the row decoder 2 and the column decoder 6, and the wordline WL is activated and turned from the "L" level to the "H" level. Upon the rise of the wordline WL, the potential of one of the bitline pair BL and $\overline{BL}$ (not shown) gradually reduces according to the data retained in the memory cell 1. Concurrently, the potential of one of the IO line pair (not shown), which is connected via the column select circuit to the bitline pair BL and $\overline{BL}$ selected by the column decoder 6, reduces likewise.

At time A, at which the potential of one of the IO line pair (the bitline pair BL and $\overline{BL}$) reduces and a sufficient potential difference between the IO line and $\overline{IO}$ line is obtained, the sense amplifier circuit 8 amplifies and reads out the potential difference in the IO line pair in response to a rise signal of the sense enable signal SE. Then, the sense amplifier circuit 8 determines, from the potential difference of the IO line pair that has been read out, whether the data read out from the memory cell 1 is "1" or "0".

In the present preferred embodiment, the memory cell potential controlling circuit SW receives a "H" level sense enable signal SE, turns the NMOS 41 to be an OFF state, and disconnects the VL line from GND, at time A. Then, the NMOS 181 is turned into an ON state by the "H" level sense enable signal SE, connecting the VL line to the power supply VM2. Consequently, the potential of the VL line gradually reduces from 0 V as shown in FIG. 19 and reaches the potential of the power supply VM2 (for example, −0.4 V). Thereafter, as the sense enable signal SE becomes the "L" level, the NMOS 181 becomes an OFF state while the NMOS 41 becomes an ON state. The potential of the VL line returns to 0 V.

Because the potential of the VL line lowers after the time A, the substrate potential of the NMOSs 22a, 22b, 24a, 24b also reduces. As a result, the substrate potential of the NMOSs 22a, 22b, 24a, 24b results in a reverse biased state, which is lower than the source potential. When the NMOSs 22a, 22b, 24a, 24b are brought to a reverse biased state, the threshold value Vth of the NMOSs 22a, 22b, 24a, 24b becomes higher due to the substrate bias effect, lowering the current drive capability of the NMOSs 22a, 22b, 24a, 24b. Therefore, the current in the memory cell 1 reduces after the time A, and the semiconductor device according to the present preferred embodiment can mitigate the potential change in the bitline pair BL and $\overline{BL}$ and thus makes it possible to reduce power consumption.

It should be noted that although the present preferred embodiment employs a configuration in which the VL line is connected to the substrate of the NMOSs 22a, 22b, 24a, 24b as illustrated in FIG. 17, the present invention is not limited thereto and it is possible to adopt a configuration in which the VL line is connected either of the substrate of the NMOSs 22a and 22b or the NMOSs 24a and 24b.

Sixth Preferred Embodiment

Next, a sixth preferred embodiment will be described below. The present preferred embodiment employs a memory cell potential controlling circuit SW shown in FIG. 20 in place of the memory cell potential controlling circuit SW of the fifth preferred embodiment. In the present preferred embodiment as well, the memory cell 1 has the circuit configuration shown in shown in FIG. 17, the source potential of NMOSs 22a, 22b, 24a, 24b is fixed to GND, and the substrate potential of the NMOSs 22a, 22b, 24a, 24b is controlled by a VL line. The overall circuit configuration is the same as that shown in FIG. 1 and therefore the detailed description is omitted.

Figure 20:
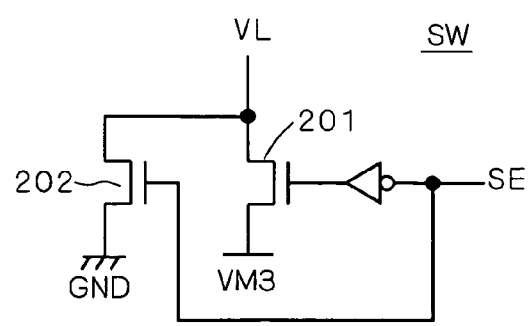
FIG. 20 is a circuit diagram of a memory cell potential controlling circuit according to a sixth preferred embodiment of the present invention.

The memory cell potential controlling circuit SW shown in FIG. 20 is provided with an NMOS 201 that performs a control of connecting or disconnecting a VL line to/from a power supply VM3 having a potential higher than GND in response to a sense enable signal SE. Also, an NMOS 202 is added such as to connect the VL line to GND when the VL line is disconnected from the power supply VM3 (when the NMOS 201 is OFF). Here, the potential of the power supply VM3 is set at about 0.4 V, for example.

In the memory cell potential controlling circuit SW shown in FIG. 20, when the sense enable signal SE is "L" (disabled), the NMOS 201 becomes an ON state; consequently, the VL line is connected to the power supply VM3 and thereby its potential is brought to about 0.4 V. When the sense enable signal SE is "H" (enabled), the NMOS 201 becomes an OFF state, disconnecting the VL line from the power supply VM3, and at the same time, the NMOS 202 becomes an ON state, connecting the VL line to GND. Accordingly, the potential of the VL line becomes 0 V.

Figure 21:
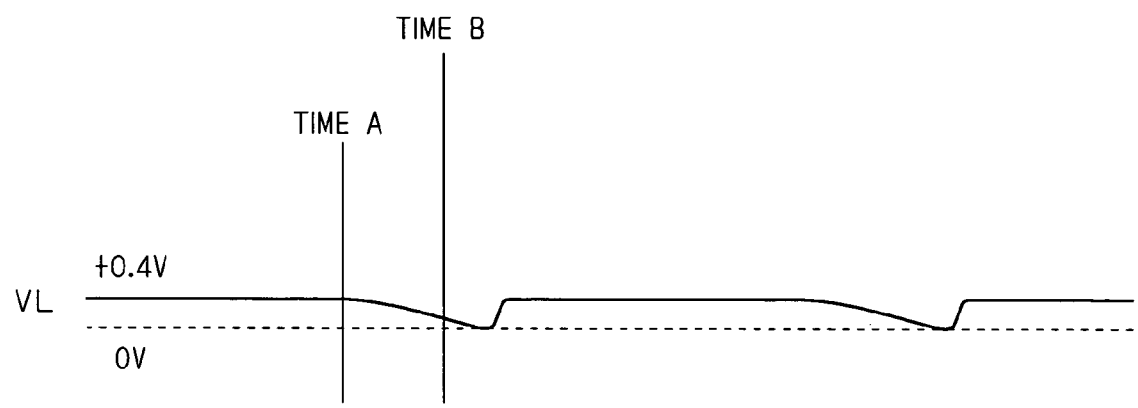
FIG. 21 is a timing chart of the semiconductor device according to the sixth preferred embodiment of the present invention.

Next, a timing chart of the semiconductor device according to the present preferred embodiment is illustrated in FIG. 21. It should be noted that the timing chart shown in FIG. 21 depicts only the potential change of the VL line that is different from that shown in the timing chart of FIG. 9, described in the fifth preferred embodiment. Hereinbelow, the operation of the semiconductor device according to the present preferred embodiment is described with reference to the timing chart of FIG. 21.

In the present preferred embodiment, the potential of the VL line is at the potential of the power supply VM3 (for example, 0.4 V) in a precharged state because the sense enable signal SE is at an "L" level. Accordingly, the substrate potential of the NMOSs 22a, 22b, 24a, 24b is higher than the source potential and is in a forward biased state.

Thereafter, in the present preferred embodiment, the memory cell potential controlling circuit SW receives a "H" level sense enable signal SE and turns the NMOS 201 into an OFF state, disconnecting the VL line from the power supply VM3, at time A. Then, the NMOS 202 is turned into an ON state by the "H" level sense enable signal SE, connecting the VL line to GND. Consequently, the potential of the VL line gradually reduces from the potential of the power supply VM3 (for example, 0.4 V) as illustrated in FIG. 21, and reaches GND. Thereafter, as the sense enable signal SE becomes the "L" level, the NMOS 202 becomes an OFF state while the NMOS 201 becomes an ON state. The potential of the VL line returns to the potential of the power supply VM3 (for example, 0.4 V).

In the present preferred embodiment, since the substrate potential is in a forward biased state before the time A, the threshold value Vth of the NMOSs 22a, 22b, 24a, 24b is lowered due to the substrate bias effect, increasing the current drive capability of the NMOSs 22a, 22b, 24a, 24b. For this reason, in the semiconductor device according to the present preferred embodiment, the read operation by the sense amplifier circuit 8 is performed in a condition in which their current drive capability is high. After the time A, the substrate potential of the NMOSs 22a, 22b, 24a, 24b is brought back to the same potential as the source potential to return the current drive capability to be low. Thereby, the present preferred embodiment can reduce the current in the memory cell 1 in comparison with that before the time A, making it possible to mitigate the potential change in the bitline pair BL and $\overline{BL}$ and thus reduce power consumption.

It should be noted that although the present preferred embodiment the configuration in which the VL line is connected to the substrate of the NMOSs 22a, 22b, 24a, 24b as illustrated in FIG. 17, the present invention is not limited thereto and may employ a configuration in which the VL line is connected to either one of the substrate of the NMOSs 22a and 22b, or the substrate of the NMOSs 24a and 24b.

Seventh Preferred Embodiment

Figure 22:
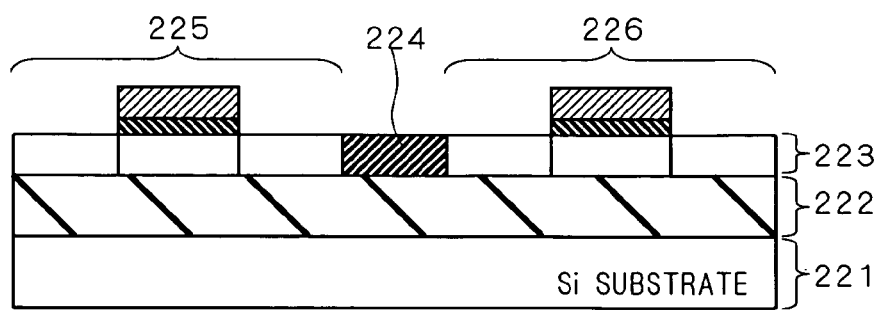
FIG. 22 is a cross-sectional view of a semiconductor device according to a seventh preferred embodiment of the present invention.

Next, a seventh preferred embodiment will be described below. Although the first to sixth preferred embodiments have basically discussed the cases that use bulk silicon substrates, the present invention is not limited thereto, and the first to sixth preferred embodiments may be applied to, for example, SOI (Silicon On Insulator) substrates. FIG. 22 shows a cross-sectional view of a semiconductor device in the case of using an SOI substrate. In the semiconductor device shown in FIG. 22, a semiconductor layer 223 is formed over a Si substrate 221, which is a supporting substrate, with a buried insulating layer 222 interposed therebetween. In the semiconductor layer 223 shown in FIG. 22, a PMOS 225 and an NMOS 220 are provided with an element isolation 224 interposed therebetween. The circuit configuration as described in the first to sixth preferred embodiments may be formed in the semiconductor layer 223.

Thus, by forming the circuits according to the first to sixth preferred embodiments on an SOI substrate, the capacitance produced between the Si substrate 221 and the diffusion layer of the PMOS 225 and the NMOS 226 (junction capacitance) can be reduced, and therefore, the parasitic capacitance in the signal lines can be reduced. For example, the use of an SOI substrate can also reduce the capacitance in the bitline pair BL and $\overline{BL}$, and the VL line illustrated in the first to sixth preferred embodiments, enabling a further reduction in power consumption and an increase in operation speed.

Eighth Preferred Embodiment

Figure 24:
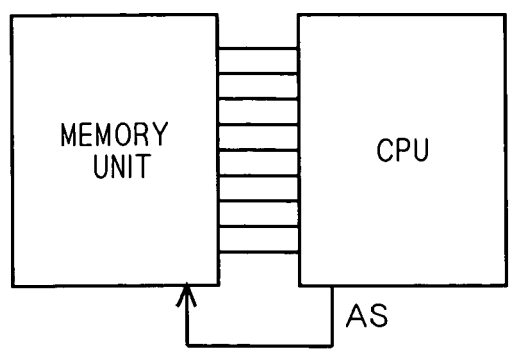
FIG. 24 is a block diagram of a semiconductor device according to an eighth preferred embodiment of the present invention.

FIG. 24 shows a block diagram of a semiconductor device according to the present preferred embodiment. FIG. 24 illustrates a semiconductor device composed of a CPU portion, which is a central processing unit, and a memory unit connected to the CPU portion by a plurality of wiring lines. The memory unit has, for example, a circuit configuration shown in FIG. 1 or 8. Further, in the semiconductor device according to the present preferred embodiment, a memory unit selecting signal AS for controlling the memory unit is supplied from the CPU portion to the memory unit. Specifically, the memory unit selecting signal AS is supplied to a memory cell potential controlling circuit SW of the memory unit and is used for the control of mitigating the potential change in the bitline pair BL and $\overline{BL}$. It should be noted that the block diagram of FIG. 24 is merely illustrative and the present invention may employ other configurations.

Next, a configuration for migrating the potential change in the bitline pair BL and $\overline{BL}$ using the memory unit selecting signal AS will be discussed. First, the configuration of the memory units is basically the same as that in FIG. 1 or FIG. 8 except that the memory unit selecting signal AS is additionally supplied to the memory cell potential controlling circuit SW, and therefore the detailed description is omitted. In the following, the configuration of the memory cell potential controlling circuit SW is discussed.

Figures 25A, 25B:
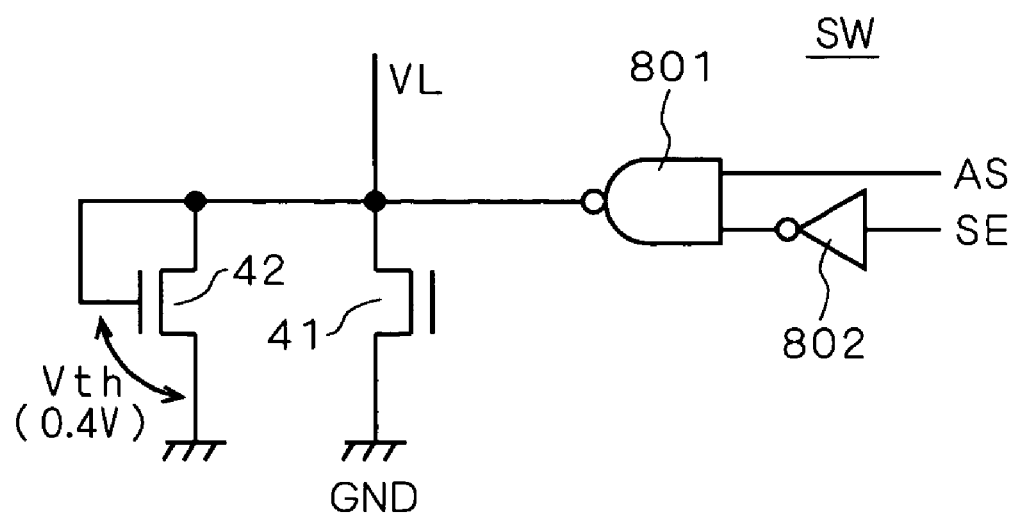
FIG. 25A is a circuit diagram of a memory cell potential controlling circuit according to the eighth preferred embodiment of the present invention.
FIG. 25B is a state diagram of a memory cell potential controlling circuit according to the eighth preferred embodiment of the present invention.

First, FIG. 25A shows a circuit diagram of the memory cell potential controlling circuit SW. In FIG. 25A, an NMOS 41 for connecting or disconnecting a VL line to/from GND is provided, as with the memory cell potential controlling circuit SW shown in FIG. 4A. In FIG. 4A, the signal input to the gate electrode of the NMOS 41 is only the sense enable signal SE via the inverter, but in FIG. 25A, the signal input to the gate electrode of the NMOS 41 is a NAND signal of the memory unit selecting signal AS and the sense enable signal SE via the inverter. Specifically, a NAND circuit 801 provided for the gate electrode of the NMOS 41, and a memory unit selecting signal AS and a sense enable signal SE via an inverter 802 are input into the NAND circuit 801.

In the memory cell potential controlling circuit SW shown in FIG. 25A as with FIG. 4A, a diode-connected NMOS 42 is also added for clamping the potential of the VL line so that it does not rise excessively when the VL line is disconnected from GND (when the NMOS 41 is OFF). The NMOS 42 has a role to prevent the data retained in the memory cell 1 from being destroyed because the potential of the VL line rises at most about 0.4 V in a normal operation assuming that the threshold voltage Vth is about 0.4 V.

FIG. 25B represents states of the memory cell potential controlling circuit SW according to the memory unit selecting signal AS and the sense enable signal SE. First, when the memory unit selecting signal AS is "H" (when the memory unit is in a selected state), the state becomes the same as that of FIG. 4B, and when the sense enable signal SE is "L" (disabled), the NMOS 41 becomes an ON state; consequently, the VL line is connected to GND and its potential is brought to 0 V. When the sense enable signal SE is "H" (enabled), the NMOS 41 becomes an OFF state; consequently, the VL line is disconnected from GND, and its potential is brought to at most about 0.4 V due to the effect of the NMOS 42.

On the other hand, when the memory unit selecting signal AS is "L" (when the memory unit is in an unselected state), the NMOS 41 becomes an OFF state irrespective of whether the sense enable signal SE is "L" or "H"; consequently, the VL line is disconnected from GND and its potential is brought to at most about 0.4 V due to the effect of the NMOS 42.

Figures 26A, 26B:
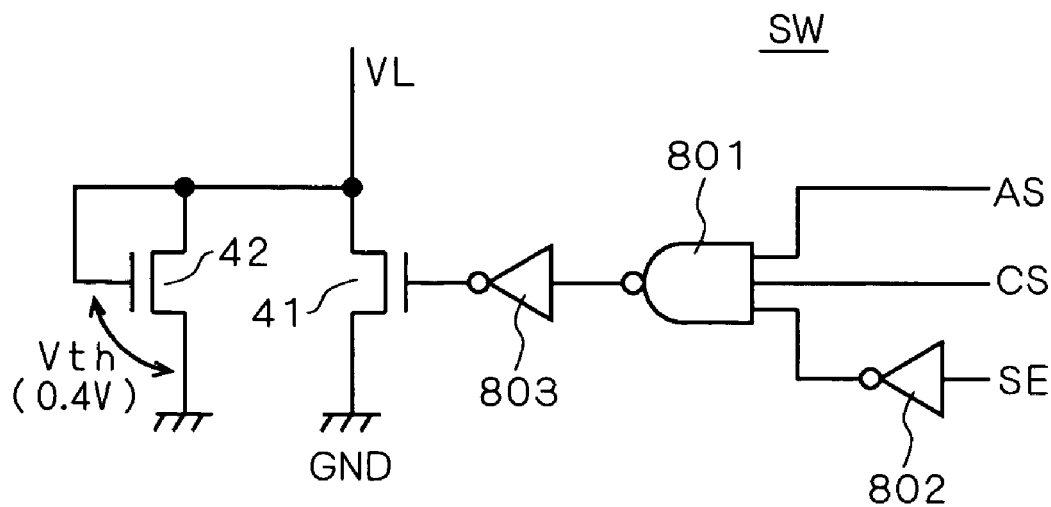
FIG. 26A is a circuit diagram of another memory cell potential controlling circuit according to the eighth preferred embodiment of the present invention.
FIG. 26B is a state diagram of another memory cell potential controlling circuit according to the eighth preferred embodiment of the present invention.

Furthermore, FIG. 26A illustrates a circuit diagram of another memory cell potential controlling circuit SW according to the present preferred embodiment. The memory cell potential controlling circuit SW shown in FIG. 26A is also provided with an NMOS 41 that performs a control of connecting or disconnecting the VL line to/from GND. Also, a diode-connected NMOS 42 is added for clamping the potential of the VL line so that it does not rise excessively when the VL line is disconnected from GND (when the NMOS 41 is OFF).

The memory cell potential controlling circuit SW shown in FIG. 26A differs from the memory cell potential controlling circuit SW shown in FIG. 25A in the respect that the signal input to the gate terminal of the NMOS 41 is a NAND signal to which a column select signal CS is further added. Specifically, in FIG. 26A, a sense enable signal SE that is inverted by the inverter 802, the memory unit selecting signal AS, and the column select signal CS are input into the NAND gate 801. The output from the NAND gate 801 is inverted by the inverter 803 and is input into the gate terminal of the NMOS 41.

Next, FIG. 26B represents states of the memory cell potential controlling circuit SW according to the memory unit selecting signal AS, the sense enable signal SE, and the column select signal CS. First, when the memory unit selecting signal AS is "H" (when the memory unit is in a selected state) and the column select signal CS is "L" (unselected state), the NMOS 41 becomes an OFF state irrespective of whether the sense enable signal SE is "L" (unselected state) or "H" (enabled); consequently, the VL line is disconnected from GND and its potential is brought to at most about 0.4 V due to the effect of the NMOS 42.

Next, when the memory unit selecting signal AS is "H" (when the memory unit is in a selected state), the sense enable signal SE is "L" (disabled), and the column select signal CS is "H" (selected state), the NMOS 41 becomes an ON state; consequently, the VL line is connected to GND and thereby its potential is brought to 0 V. In addition, when the memory unit selecting signal AS is "H" (when the memory unit is in a selected state), the sense enable signal SE and the column select signal CS are "H" (enable and selected state), the NMOS 41 becomes an OFF state; consequently, the VL line is disconnected from GND and its potential is brought to at most about 0.4 V due to the effect of the NMOS 42.

Next, when the memory unit selecting signal AS is "L" (when the memory unit is in an unselected state), the NMOS 41 becomes an OFF state irrespective of the conditions of the sense enable signal SE and the column select signal CS; consequently the VL line is disconnected from GND and its potential is brought to at most about 0.4 V due to the effect of the NMOS 42.

The operations of the memory unit in the cases in which the configurations shown in FIGS. 25A and 26A are used for the memory cell potential controlling circuit SW are basically the same as the operations described in the first preferred embodiment and the second preferred embodiment. That is, the timing chart of the memory unit in the cases of using the configurations of FIGS. 25A and 26A is similar to those shown in FIGS. 5 and 10. Nevertheless, when the memory unit selecting signal AS is "L" (when the memory unit is in an unselected state), the same result is obtained as in the case of the unselected column in the timing chart shown in FIG. 10. That is, the potential change of the bitline pair BL and $\overline{BL}$ is mitigated from the time point at which a wordline WL is activated. Therefore, the semiconductor device according to the present preferred embodiment can reduce power consumption even when the memory unit is in an unselected state.

It should be noted that although in the present preferred embodiment the memory unit selecting signal AS is supplied only to the memory cell potential controlling circuit SW, the present invention is not limited thereto and the memory unit selecting signal AS may be supplied to the row decoder 2 and the column decoder 6 so as to be utilized as a control signal.

In addition, the present preferred embodiment employs a configuration in which a memory unit selecting signal AS is directly supplied from the CPU portion to the memory unit, as illustrated in FIG. 24; however, the present invention is not limited to this configuration and the memory unit selecting signal AS may be supplied to the memory unit using the circuit configuration shown in FIG. 27. In the circuit configuration shown in FIG. 27, a decoder 825 and four AND circuits 826 to 829 are provided so that respective memory unit selecting signals AS can be supplied to four memory units 821 to 824. When a memory unit selecting address is supplied from the CPU portion (not shown) to the decoder 825, respective signals are output from the decoder 825 to the AND circuits 826 to 829. The AND circuits 826 to 829 perform an AND operation between these signals and a chip enable signal CE from the CPU portion (not shown), and the output is supplied to the memory units 821 to 824 as the memory unit selecting signals AS.

Thus, the semiconductor device according to the present preferred embodiment can mitigate the potential change in the bitline pair BL and $\overline{BL}$ by mitigating means even when the memory unit selecting signals AS supplied from the CPU portion to the memory units are in an unselected state "L"

(when the memory units are in a stand-by state), and therefore, a further reduction in power consumption is possible.

Ninth Preferred Embodiment

Figure 28:
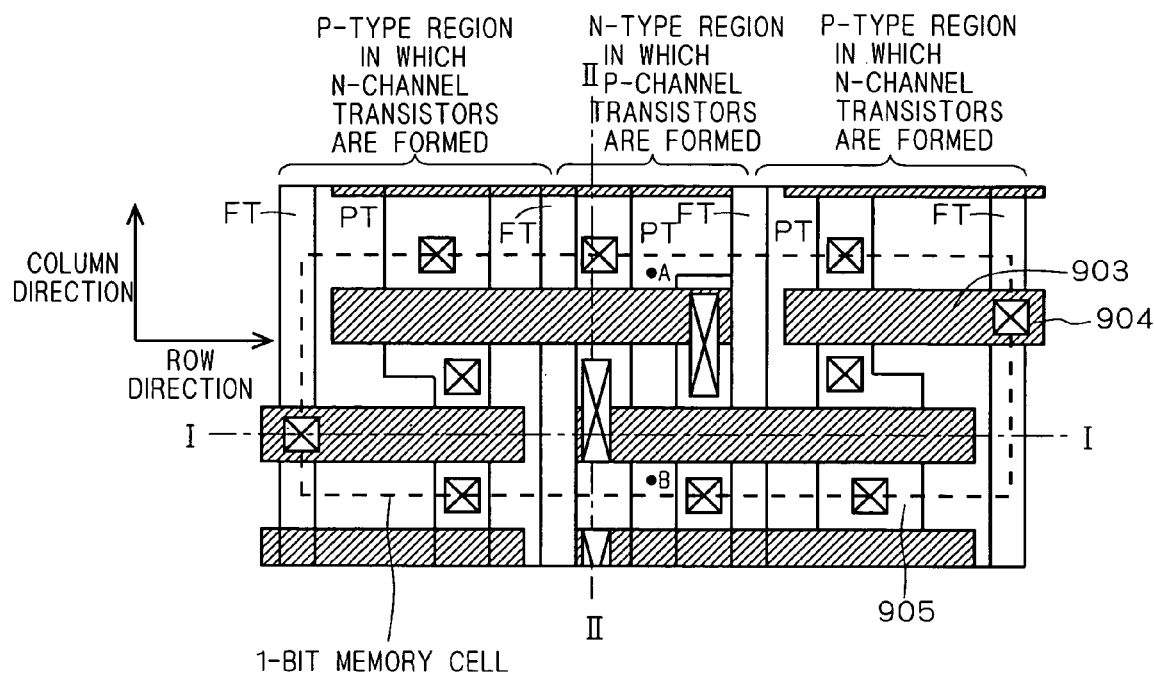
FIG. 28 is a plan view of a semiconductor device according to a ninth preferred embodiment of the present invention.
Figure 29:
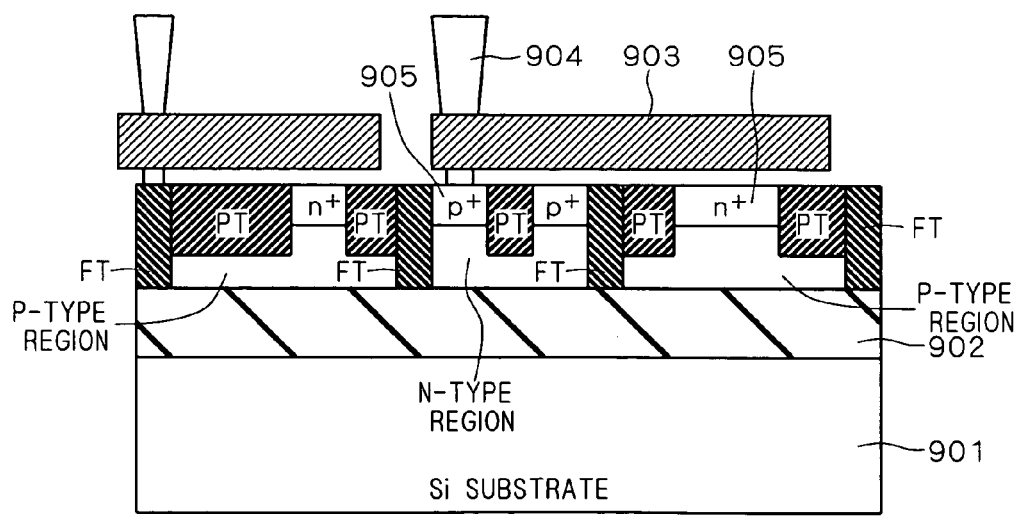
FIG. 29 is a cross-sectional view of the semiconductor device according to the ninth preferred embodiment of the present invention.

FIG. 28 illustrates a layout plan view of a semiconductor device according to the present preferred embodiment. FIG. 29 illustrates a cross-sectional view of the semiconductor device taken along line I-I of FIG. 28. The semiconductor device according to the present preferred embodiment adopts a hybrid-type SOI structure, in which full trench (FT) isolation and partial trench (PT) isolation are combined.

First, as illustrated in FIG. 28, the semiconductor device according to the present preferred embodiment has a configuration in which a P-type region in which NMOS transistors are formed (hereinafter simply referred to as a "P-type region")—a N-type region in which PMOS transistors are formed (hereinafter simply referred to as a "N-type region")—a P-type region in which NMOS transistors are formed, are arranged in that order along the row direction, and the P-type regions and the N-type region extend along the column direction. As illustrated in FIGS. 28 and 29, the P-type regions and the N-type region are isolated by full trench (FT) isolation, while partial trench (PT) isolation is used for the element isolation within each of the regions. As illustrated in FIG. 29, the full trench (FT) isolation is made by forming the trenches such as to reach a buried insulating layer 902 on a Si substrate 901. On the other hand, the partial trench (PT) isolation is effected so that the trenches do not reach the buried insulating layer 902.

The layout shown in FIG. 28 depicts a diffusion region 905, gate wiring lines 903, which form the first layer of the semiconductor device, and contact holes 904. A portion that constitutes a 1-bit memory cell 1 is shown as a portion surrounded by the dashed line in FIG. 28. This portion surrounded by the dashed line is formed so as to straddle over the P-type region—the N-type region—the P-type region. Further, the portion surrounded by the dashed line has a mirror-like symmetry with respect to the vertical direction of FIG. 28. It should be noted that, although not shown in the figure, GND lines, power supply voltage VDD lines, bitline pairs BL and $\overline{BL}$, and so forth are further stacked over the first layer in the semiconductor device according to the present preferred embodiment.

Next, in the semiconductor device according to the present preferred embodiment, the P-type regions and the N-type region are electrically isolated completely by full trenches (FT), as will be appreciated from FIG. 29. However, only the partial trenches (PT) are used within each of the P-type regions and the N-type region without providing full trenches (FT). For this reason, each P-type region is electrically coupled in the column direction within each area of the P-type regions, and also the N-type region is electrically coupled in the column direction within the area of the N-type region.

Figure 30:
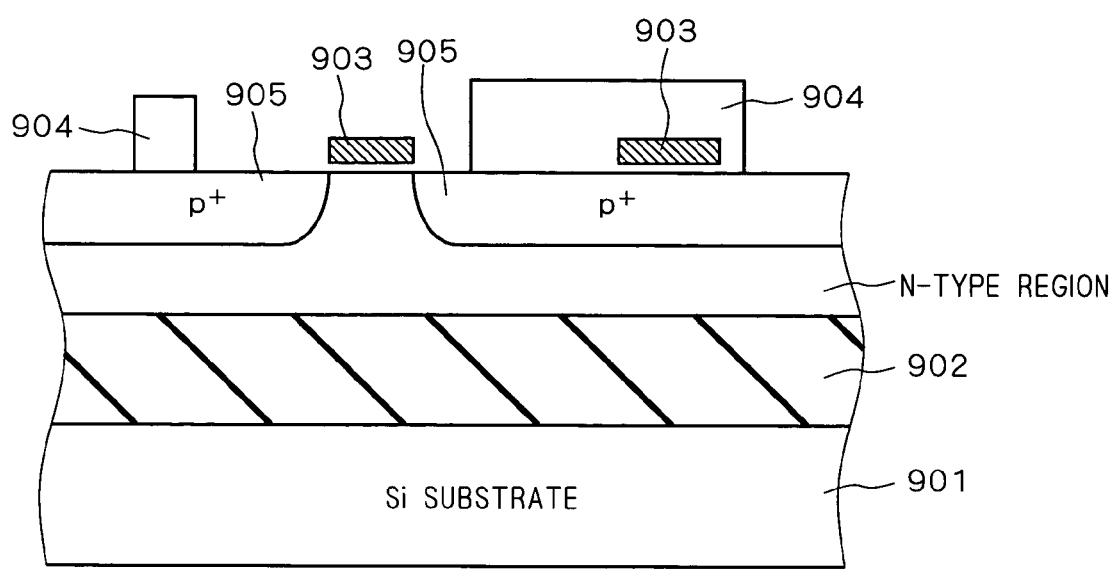
FIG. 30 is another cross-sectional view of the semiconductor device according to the ninth preferred embodiment of the present invention.

FIG. 30 is a cross-sectional view of the semiconductor device taken along line II-II of FIG. 28. Although FIG. 30 depicts a PMOS structure having a P+ diffusion region 905, a plurality of structures, each of which has the same structure shown in FIG. 30, are repeatedly formed extending in the horizontal directions in the semiconductor device according to the present preferred embodiment. Although FIG. 30 does not show partial trenches (PT), a partial trench (PT) is provided within the N-type region, as shown in FIG. 28. Thus, the N-type region at a location A and the N-type region at a location B shown in FIG. 28 are coupled below the partial trench (PT). In other words, since the N-type regions are coupled in the column direction, it is possible to control the potential of the N-type regions column by column. Likewise, the P-type regions are also coupled in the column direction, and therefore it is possible to control the potential of the P-type regions column by column.

That is, by applying the hybrid-type SOI structure described in the present preferred embodiment to the memory cells 1 shown in FIG. 17, etc., it becomes possible to control the substrate potential of the NMOSs 22a, 22b, 24a, 24b column by column easily.

While the invention has been shown and described in detail, the foregoing description is in all aspects illustrative and not restrictive. It is therefore understood that numerous other modifications and variations can be devised without departing from the scope of the invention.

What is claimed is:

1. A semiconductor device having a memory unit that does not require a refresh operation, comprising:
   memory circuits for storing data, arranged in a matrix form;
   first signal lines for reading said data from said memory circuits;
   second signal lines for transferring a signal that controls connection between said memory circuits and said first signal lines;
   a sense amplifier circuit for reading and determining data by detecting a potential change or a current change in said first signal lines; and
   mitigating means for mitigating said potential change or said current change in said first signal lines during a period in which said sense amplifier circuit is being activated, wherein
   each of said memory circuits comprises a first inverter and a second inverter that constitute an inverter latch for storing said data, and
   said mitigating means comprises a potential control circuit, being arranged between GND and source terminals of NMOSs that constitute said first and second inverters and controlling connection between said source terminal and said GND based on an activating signal for said sense amplifier circuit.

2. A semiconductor device having a memory unit that does not require a refresh operation, comprising:
   memory circuits for storing data, arranged in a matrix form;
   first signal lines for reading said data from said memory circuits;
   second signal lines for transferring a signal that controls connection between said memory circuits and said first signal lines;
   a sense amplifier circuit for reading and determining data by detecting a potential change or a current change in said first signal lines; and
   mitigating means for mitigating said potential change or said current change in said first signal lines during a period in which said sense amplifier circuit is being activated, wherein
   each of said memory circuits comprises a first inverter and a second inverter that constitute an inverter latch for storing said data, and
   said mitigating means comprises a potential control circuit, being arranged between source terminals of a PMOSs that constitute said first and second inverters and a power supply and controlling connection between said source terminal and said power supply based on an activating signal for said sense amplifier circuit.

3. A semiconductor device having a memory unit that does not require a refresh operation, comprising:
memory circuits for storing data, arranged in a matrix form;
first signal lines for reading said data from said memory circuits;
second signal lines for transferring a signal that controls connection between said memory circuits and said first signal lines;
a sense amplifier circuit for reading and determining data by detecting a potential change or a current change in said first signal lines; and
mitigating means for mitigating said potential change or said current change in said first signal lines during a period in which said sense amplifier circuit is being activated, wherein
each of said memory circuits comprises a first inverter and a second inverter that constitute an inverter latch for storing said data, and transfer MOS transistors for connecting said first and second inverters to said first signal line, and
said mitigating means comprises a potential control circuit for controlling at least one of a substrate potential of NMOSs that constitute said first and second inverters, and a substrate potential of said transfer MOS transistors, based on an activating signal for said sense amplifier circuit.

4. The semiconductor device according to claim 3, wherein said potential control circuit controls at least one of said substrate potential of said NMOSs that constitute said first and second inverters and said substrate potential of said transfer MOS transistors to be lower than source potentials of NMOSs that constitute said first and second inverters during a period in which said activating signal activates said sense amplifier circuit.

5. The semiconductor device according to claim 3, wherein said potential control circuit controls at least one of said substrate potential of said NMOSs that constitute said first and second inverters and said substrate potential of said transfer MOS transistors so that at least one of said substrate potentials becomes equal to source potentials of said NMOSs that constitute said first and second inverters during a period in which said activating signal activates said sense amplifier circuit, and that at least one of said substrate potentials becomes higher than said source potentials of said NMOSs that constitute said first and second inverters during a period other than said period.

6. A semiconductor device having a memory unit that does not require a refresh operation, comprising:
memory circuits for storing data, arranged in a matrix form;
first signal lines for reading said data from said memory circuits;
second signal lines for transferring a signal that controls connection between said memory circuits and said first signal lines;
a sense amplifier circuit for reading and determining data by detecting a potential change or a current change in said first signal lines; and
mitigating means for mitigating said potential change or said current change in said first signal lines during a period in which said sense amplifier circuit is being activated, wherein
said mitigating means mitigates said potential change or said current change in only first signal lines for which reading is being performed among said first signal lines.

7. A semiconductor device having a memory unit that does not require a refresh operation, comprising:
memory circuits for storing data, arranged in a matrix form;
first signal lines for reading said data from said memory circuits;
second signal lines for transferring a signal that controls connection between said memory circuits and said first signal lines;
a sense amplifier circuit for reading and determining data by detecting a potential change or a current change in said first signal lines; and
mitigating means for mitigating said potential change or said current change in said first signal lines during a period in which said sense amplifier circuit is being activated, wherein
the semiconductor device is formed on an SOI substrate.

8. A semiconductor device comprising:
a plurality of memory cells arranged in a matrix form;
first signal lines for transferring data read out from said memory cells;
second signal lines for transferring a signal that controls electrical connection between said memory cells and said first signal lines;
a sense amplifier circuit for determining data by detecting a change in said first signal lines that occurs based on said data read out from said memory cells in a reading operation; and
a potential control circuit, connected to a predetermined node of said memory cells, for mitigating, based on an activating signal for said sense amplifier circuit, said change in said first signal lines that occurs based on said data read out from said memory cells in said reading operation.

9. A semiconductor device comprising:
a plurality of memory units that do not require a refresh operation; and
a central processing unit for controlling said memory units;
each of said memory units including:
memory circuits for storing data, arranged in a matrix form;
first signal lines for reading said data from said memory circuits;
second signal lines for transferring a signal that controls connection between said memory circuits and said first signal lines;
a sense amplifier circuit for reading and determining data by detecting a potential change or a current change in said first signal line; and
mitigating means for mitigating said potential change or said current change in said first signal lines during a period in which said sense amplifier circuit is being activated,
wherein said mitigating means mitigates said potential change or said current change in said first signal lines even when a memory unit selecting signal supplied from said central processing unit to said memory units is in an unselected state.

10. A semiconductor device having a memory unit that does not require a refresh operation, comprising:
memory circuits for storing data, arranged in a matrix form;
first signal lines for reading said data from said memory circuits;

second signal lines for transferring a signal that controls connection between said memory circuits and said first signal lines;

a sense amplifier circuit for reading and determining data by detecting a potential change or a current change in said first signal lines; and mitigating means for mitigating said potential change or said current change in said first signal lines during a period in which said sense amplifier circuit is being activated, wherein the semiconductor device is formed on an SOI substrate having electrically coupled P regions and electrically coupled N regions along a column direction in which said memory circuits are formed.

11. The semiconductor device according to claim 9, being formed on an SOI substrate having electrically coupled P regions and electrically coupled N regions along a column direction in which said memory circuits are formed.

12. A semiconductor device having a memory unit that does not require a refresh operation, comprising:

memory circuits for storing data, arranged in a matrix form;

first signal lines for reading said data from said memory circuits;

second signal lines for transferring a signal that controls connection between said memory circuits and said first signal lines;

a sense amplifier circuit for reading and determining data by detecting a potential change or a current change in said first signal lines; and mitigating means for mitigating said potential change or said current change in said first signal lines during a period in which said sense amplifier circuit is being activated, wherein said first signal lines extend along a column direction of said plurality of memory circuits arranged in a matrix form, and said mitigating means is provided correspondingly to said plurality of memory circuits arranged in said column direction, and is arranged on said first signal lines in said column direction.

13. The semiconductor device according to claim 9, wherein said first signal lines extend along a column direction of said plurality of memory circuits arranged in a matrix form, and said mitigating means is provided correspondingly to said plurality of memory circuits arranged in said column direction, and is arranged on said first signal lines in said column direction.

14. The semiconductor device according to claim 12, wherein said first signal lines are connected to said plurality of memory circuits and said sense amplifier circuit in this order, and said mitigating means is connected to said first signal lines in said column direction in which said sense amplifier circuit is arranged, when viewed from a side on which said plurality of memory circuits are arranged.

15. The semiconductor device according to claim 13, wherein said first signal lines are connected to said plurality of memory circuits and said sense amplifier circuit in this order, and said mitigating means is connected to said first signal lines in said column direction in which said sense amplifier circuit is arranged, when viewed from a side on which said plurality of memory circuits are arranged.

* * * * *